United States Patent
Chang et al.

(10) Patent No.: US 11,097,941 B2
(45) Date of Patent: Aug. 24, 2021

(54) METHOD OF FABRICATING SEMICONDUCTOR STRUCTURE

(71) Applicant: TAIWAN SEMICONDUCTOR MANUFACTURING CO., LTD., Hsinchu (TW)

(72) Inventors: Yi-Hsien Chang, Changhua County (TW); Tzu-Heng Wu, New Taipei (TW); Chun-Ren Cheng, Hsinchu (TW); Shih-Wei Lin, Taipei (TW); Jung-Kuo Tu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/398,013

(22) Filed: Apr. 29, 2019

(65) Prior Publication Data
US 2019/0256347 A1    Aug. 22, 2019

Related U.S. Application Data

(62) Division of application No. 14/599,218, filed on Jan. 16, 2015, now Pat. No. 10,273,140.

(51) Int. Cl.
*B81B 3/00* (2006.01)

(52) U.S. Cl.
CPC ...... *B81B 3/0005* (2013.01); *B81B 2207/015* (2013.01); *B81C 2201/019* (2013.01); *B81C 2201/112* (2013.01); *B81C 2203/0785* (2013.01)

(58) Field of Classification Search
None
See application file for complete search history.

(56) References Cited

U.S. PATENT DOCUMENTS

| | | | |
|---|---|---|---|
| 8,723,280 B2 | 5/2014 | Shu et al. | |
| 2005/0170656 A1* | 8/2005 | Nasiri | B81C 1/00238 438/700 |
| 2006/0234412 A1* | 10/2006 | Lazaroff | B81C 1/0092 438/48 |
| 2006/0278942 A1 | 12/2006 | Rubel | |
| 2009/0017260 A1 | 1/2009 | Kulkarni | |
| 2009/0029513 A1 | 1/2009 | Blanchard | |
| 2012/0244677 A1 | 9/2012 | Lin | |
| 2012/0329272 A1* | 12/2012 | Arnold | H01L 21/0273 438/653 |
| 2013/0043510 A1* | 2/2013 | Shu | B81C 1/00269 257/254 |

(Continued)

FOREIGN PATENT DOCUMENTS

| | | |
|---|---|---|
| CN | 102441600 A | 5/2012 |
| CN | 102838079 A | 12/2012 |
| CN | 103569942 A | 2/2014 |

*Primary Examiner* — Xiaoming Liu
(74) *Attorney, Agent, or Firm* — Maschoff Brennan

(57) ABSTRACT

A method includes forming a recess in a first substrate, bonding a micro-electro-mechanical systems (MEMS) substrate to the first substrate after forming the recess in the first substrate, forming an anti-stiction layer over the micro-electro-mechanical systems (MEMS) substrate, patterning the anti-stiction layer, etching the MEMS substrate to form a MEMS device, and bonding the MEMS device and the first substrate to a second substrate. The patterned anti-stiction layer is between the MEMS device and the second substrate.

20 Claims, 21 Drawing Sheets

(56) References Cited

U.S. PATENT DOCUMENTS

| | | | |
|---|---|---|---|
| 2013/0099355 A1* | 4/2013 | Liu | B81B 3/0021 |
| | | | 257/532 |
| 2013/0187245 A1 | 7/2013 | Chien | |
| 2014/0077317 A1 | 3/2014 | Hsieh | |
| 2014/0131770 A1* | 5/2014 | Chen | C30B 25/183 |
| | | | 257/192 |
| 2014/0134607 A1* | 5/2014 | Lin | G01N 33/5438 |
| | | | 435/5 |
| 2014/0239353 A1 | 8/2014 | Daneman | |
| 2015/0102390 A1 | 4/2015 | Liu | |
| 2015/0264464 A1 | 9/2015 | Okugawa | |
| 2015/0346391 A1 | 12/2015 | Gelder | |
| 2015/0375994 A1* | 12/2015 | Chien | B81C 1/00238 |
| | | | 257/43 |

* cited by examiner

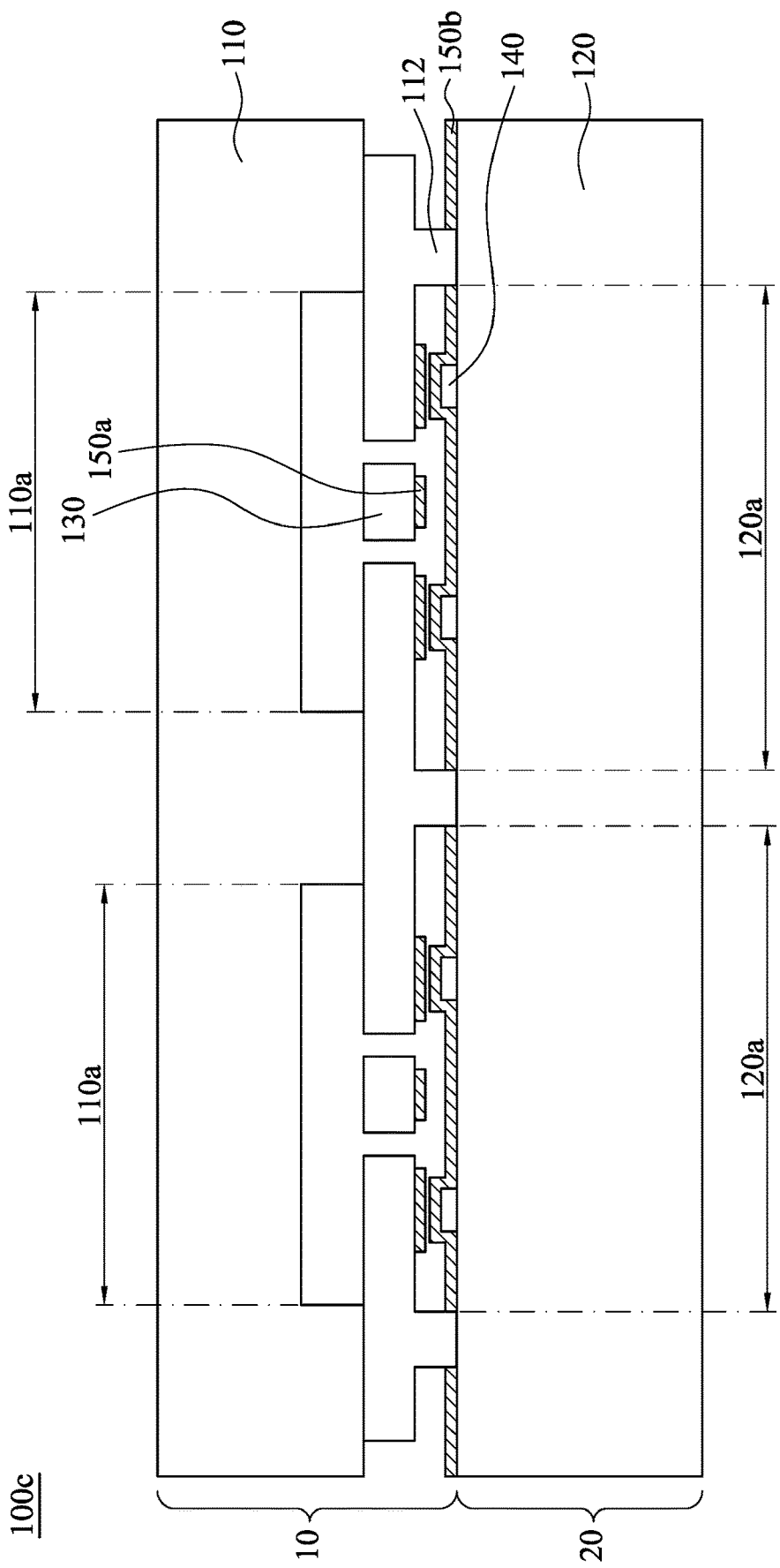

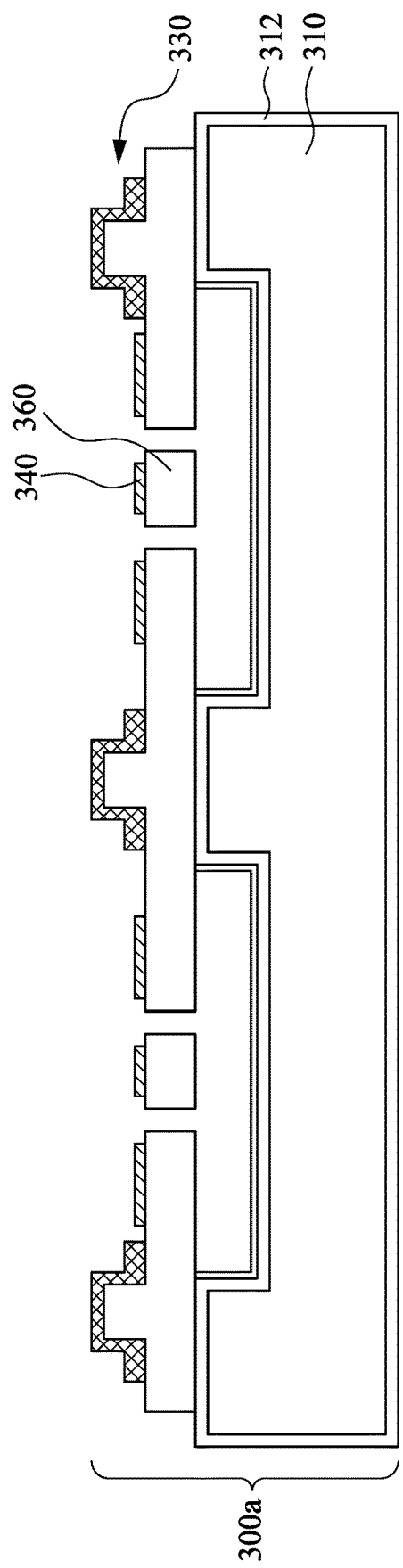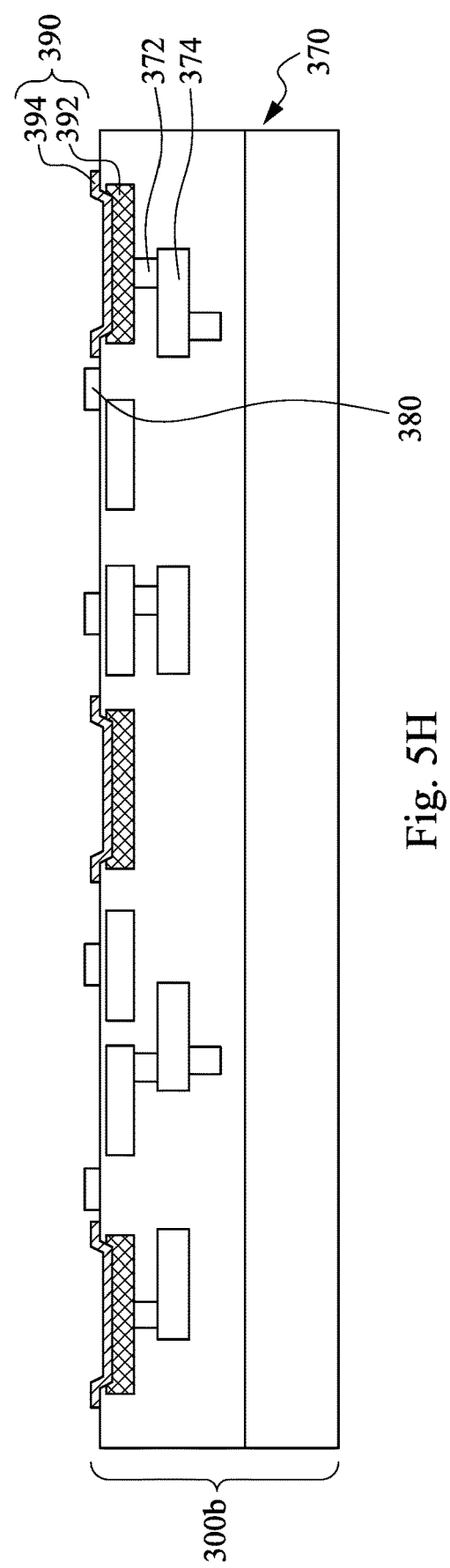
Fig. 5G
Fig. 5H

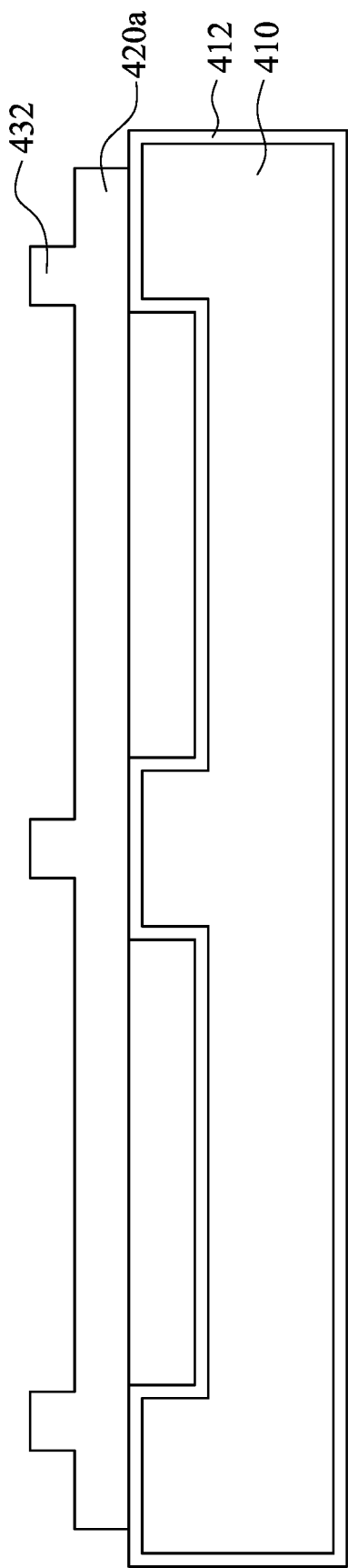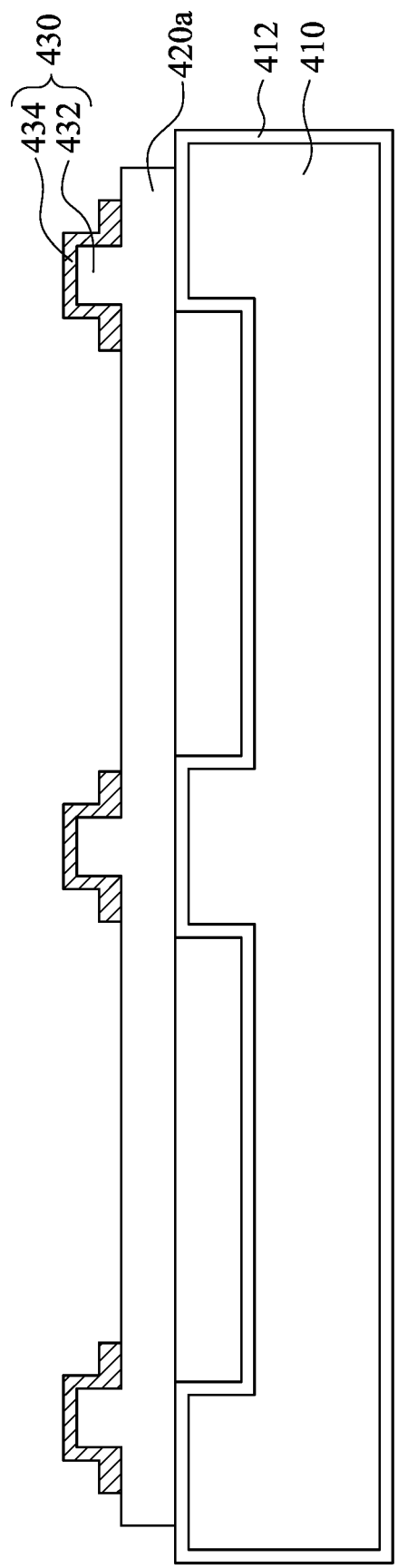

METHOD OF FABRICATING SEMICONDUCTOR STRUCTURE

PRIORITY CLAIM AND CROSS-REFERENCE

This application is a divisional of U.S. patent application Ser. No. 14/599,218, filed on Jan. 16, 2015, issued as U.S. Pat. No. 10,273,140 on Apr. 30, 2019, which is herein incorporated by reference in its entirety.

BACKGROUND

Micro-Electro-Mechanical Systems (MEMS) are a technology generally referred to as miniaturized devices combining both electrical and mechanical components. MEMS devices are utilized in a variety of environments, such as accelerometers, pressure sensors, gyroscopes, compasses, oscillators, actuators, mirrors, heaters, and printer nozzles, and are recently developed to be incorporated into integrated circuit (IC) devices. In general, a MEMS structure includes a substrate structure with MEMS devices and a cap structure, and the MEMS devices are positioned therebetween.

As the advance in technology, it is desired to have a MEMS structure with enhanced sensitivity, which can be accomplished by a less stiff MEMS device. However, the less stiff MEMS device is prone to stick on the substrate of the MEMS structure during usage. Accordingly, there are needs for a MEMS structure with improved anti-stiction performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2C is a schematic cross-sectional view of a semiconductor structure in accordance with some embodiments.

FIGS. 5A through 5I are cross-sectional views at various stages of manufacturing a semiconductor structure in accordance some embodiments.

FIGS. 6A through 6I are cross-sectional views at various stages of manufacturing a semiconductor structure in accordance with some embodiments.

DETAILED DESCRIPTION

Figure 1:
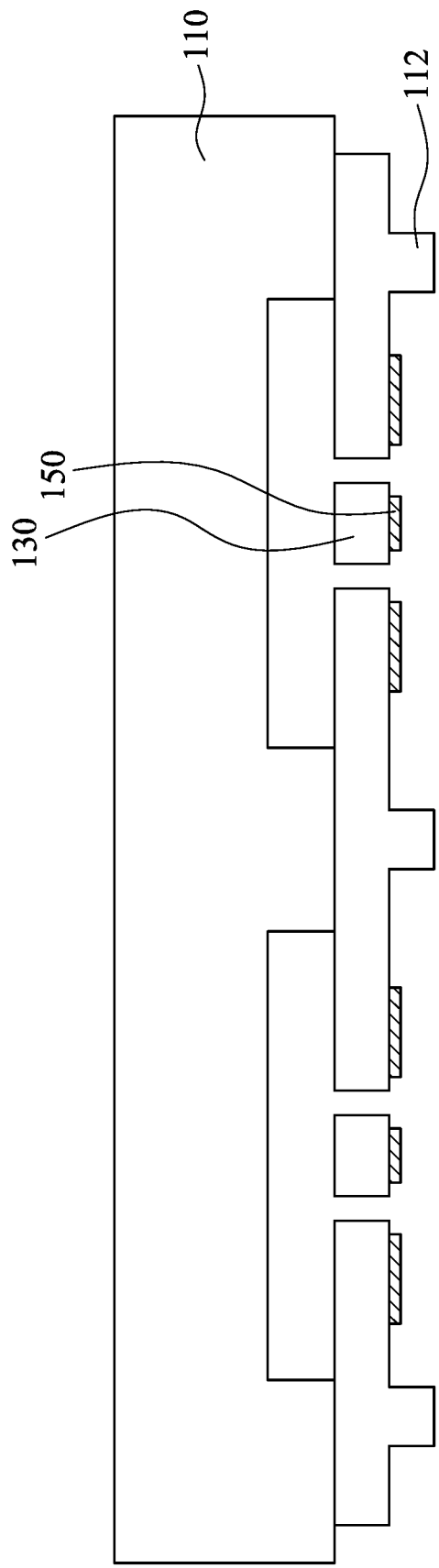
FIG. 1 is a schematic cross-sectional view of a substrate structure for a micro electro mechanical system (MEMS) device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As aforementioned, it becomes more challenging for improving the anti-stiction performance of a micro electro mechanical system (MEMS) structure with enhanced sensitivity. To enhance the sensitivity of the MEMS structure, a MEMS device inside the MEMS structure has to be less stiff to move more sensitively. However, the stiction of the less stiff MEMS device on a substrate of the MEMS structure is easily occurred during the usage of MEMS structure. The occurrence of the stiction of the MEMS device depends on capillary force, Vander Wall force, and electrostatic force of surfaces of the MEMS device and the substrate, and restoration force of the MEMS device. The restoration force of the MEMS device has to be greater than the sum of the capillary force, Vander Wall force, and electrostatic force to let the MEMS device back to former position without being stuck on the substrate. Currently, self-assembled monolayers (SAM) coating is applied in the MEMS structure to prevent the MEMS device from sticking on the substrate of the MEMS structure. The SAM coating has anti-stiction properties of hydrophobic and low adhesion force, and is beneficial to reduce capillary force of the substrate. However, the SAM coating has poor resistance to thermal process, and most processes after forming the SAM coating are performed under high temperature, such as bonding process and packaging process. The anti-stiction properties of the SAM coating would degrade after the thermo processes. Therefore, a MEMS structure with improved anti-stiction properties is continually required to be developed.

In order to solve the above-mentioned problems, the present disclosure provides a substrate structure for a MEMS device, a semiconductor structure and a method for fabricating the same. The substrate structure and the semiconductor structure include an anti-stiction layer, which can prevent the MEMS device from sticking on a substrate during the usage of semiconductor structure.

FIG. 1 is a schematic cross-sectional view of a substrate structure 10 for a MEMS device in accordance with some embodiments. The substrate structure 10 includes a substrate 110, a MEMS device 130, and an anti-stiction layer 150. The MEMS device 130 is over the substrate 110. The anti-stiction layer 150 is on a surface of the MEMS device 130, and includes amorphous carbon (α-carbon), polytetrafluoroethene (Teflon), hafnium oxide (HfO$_2$), tantalum oxide (Ta$_2$O$_5$), zirconium oxide (ZrO$_2$), or a combination thereof.

The substrate 110 may include a silicon substrate or a non-silicon substrate, such as a ceramic substrate. In some embodiments, the substrate 110 includes an elementary semiconductor, such as silicon or germanium in crystal, polycrystalline, and an amorphous structure; a compound semiconductor, such as silicon carbide, gallium arsenic, gallium phosphide, indium phosphide, indium arsenide, and indium antimonide; an alloy semiconductor, such as SiGe, GaAsP, AlInAs, AlGaAs, GaInAs, GaInP, and GaInAsP; or a combination thereof.

In some embodiments, the substrate structure 10 includes a bond ring 112 over the substrate 110 to bond the substrate 110 with another substrate (not shown) for the MEMS device 130.

The substrate structure may further include an etch stop layer on the substrate facing toward the MEMS device.

The MEMS device 130 may be any suitable device. Examples of the MEMS device 130 include but not limited to a spring, a proof mass, an actuator, a sensor, a valve, a gear, a gyroscope, a lever, and a hinge. Common application of the MEMS device 130 may include accelerometers, pressure sensors, gyroscopes, compasses, microphone, oscillators, actuators, mirrors, heaters, and printer nozzles.

The anti-stiction layer 150 includes a material that is hydrophobic, such as amorphous carbon and Teflon, or with low adhesion force, such as amorphous carbon, hafnium oxide (HfO$_2$), tantalum oxide (Ta$_2$O$_5$), and zirconium oxide (ZrO$_2$). Therefore, the anti-stiction layer 150 on the MEMS device 130 can prevent the MEMS device 130 from sticking on another substrate for the MEMS device 130. Further, the material of the anti-stiction layer 150 is high thermo resistant, and thus can keep the properties of hydrophobic and/or low adhesion force of the anti-stiction layer 150 after the subsequent bonding and packaging processes. The anti-stiction layer 150 can reduce the capillary force of the surface that the anti-stiction layer 150 deposited thereon, i.e. the surface of the MEMS device 130, and thus the stiction of the MEMS device 130 would not take place during usage.

Figure 2A:
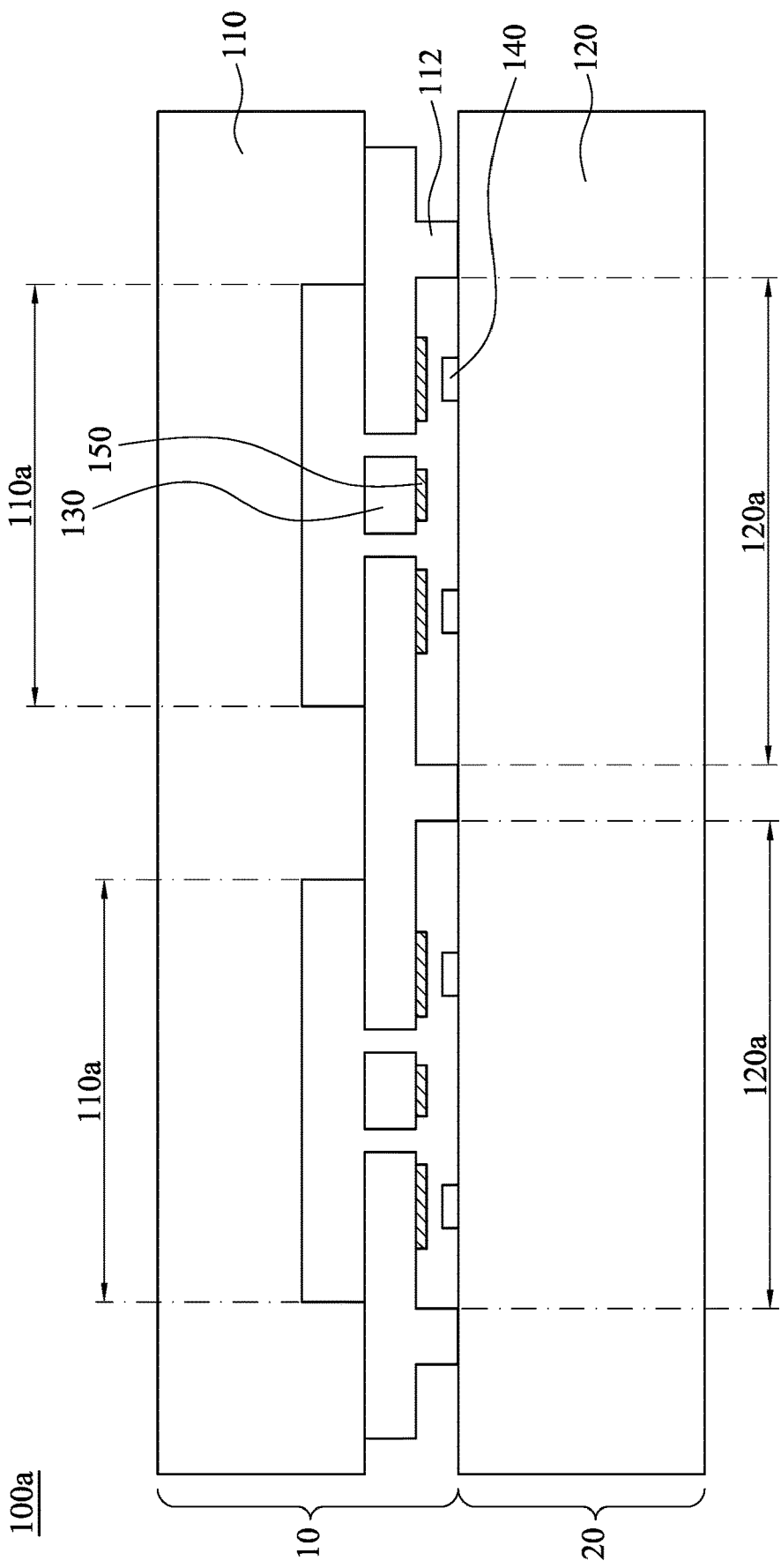
FIG. 2A is a schematic cross-sectional view of a semiconductor structure in accordance with some embodiments.

FIG. 2A is a schematic cross-sectional view of a semiconductor structure 100a in accordance with some embodiments. The semiconductor structure 100a includes a first substrate 110, a second substrate 120, MEMS devices 130, bump structures 140, and an anti-stiction layer 150. The first substrate 110 includes first portions 110a, and the second substrate 120 includes second portions 120a. The second substrate 120 is substantially parallel to the first substrate 110, and the second portions 120a are substantially aligned with the first portions 110a. The term "substantially aligned" refers to align with some acceptable deviation and does not require exact alignment. The first portion 110a is a recess. Each of the MEMS devices 130 is between the first portion 110a and the second portion 120a. The bump structures 140 are on the second portion 120a. The anti-stiction layer 150 is on surfaces of the MEMS devices 130 facing toward the second portions 120a, and includes amorphous carbon (α-carbon), polytetrafluoroethene (Teflon), hafnium oxide (HfO$_2$), tantalum oxide (Ta$_2$O$_5$), zirconium oxide (ZrO$_2$), or a combination thereof. In embodiments, the semiconductor structure 100a is a MEMS structure.

The first substrate 110 is comprised in a substrate structure 10, and the substrate structure 10 further includes bond rings 112 over the first substrate 110. The second substrate 120 is comprised in a cap structure 20. The first substrate 110 is bonded to the second substrate 120 through the bond rings 112.

The first substrate 110 and the second substrate 120 may include the same or different materials, and may include any suitable combination of materials. In some embodiments, the first substrate 110 and/or the second substrate 120 includes a silicon substrate or a non-silicon substrate, such as a ceramic substrate. In some embodiments, the first substrate 110 and/or the second substrate 120 includes an elementary semiconductor, such as silicon or germanium in crystal, polycrystalline, and an amorphous structure; a compound semiconductor, such as silicon carbide, gallium arsenic, gallium phosphide, indium phosphide, indium arsenide, and indium antimonide; an alloy semiconductor, such as SiGe, GaAsP, AlInAs, AlGaAs, GaInAs, GaInP, and GaInAsP; or a combination thereof. Further, the first substrate 110 and the second substrate 120 may be a semiconductor on insulator (SOI). In some embodiments, the first substrate 110 and the second substrate 120 include a doped epi layer. In other embodiments, the first substrate 110 and the second substrate 120 include a multilayer compound semiconductor structure. Alternatively, the first substrate 110 and the second substrate 120 include a non-semiconductor material, such as a glass, fused quartz, or calcium fluoride.

The second substrate 120 may further include integrated circuits (not shown), such as memory cells, analog circuits, logic circuits and/or mixed-signal circuits. In some embodiments, the second substrate 120 includes passive components, such as resistors, capacitors, inductors, and fuses; and active components, such as P-channel field effect transistors (PFETs), N-channel field effect transistors (NFETs), metal-oxide-semiconductor field effect transistors (MOSFETs), complementary metal-oxide-semiconductor transistors (CMOSs), high voltage transistors, and high frequency transistors; or a combination thereof. In some embodiments, the second substrate 120 includes one or more CMOS devices, such as transistors (e.g., NMOS and PMOS transistors). In other embodiments, the second substrate 120 includes circuitry associated with the transistors such as interconnect layers (e.g., metal lines and vias) and interlayer dielectric (ILD) layers. In some embodiments, the second substrate 120 also includes isolation structures and/or any other elements associated with integrated circuitry.

The MEMS device 130 may be any suitable device, and the specific features of the MEMS device may be referred to those exemplified for the MEMS device 130 of FIG. 1.

The bump structures 140 may be made of oxide, nitride, or a combination thereof. In some embodiments, the bump structures 140 are made of silicon nitride (SiN). The anti-stiction bumps 140 can release charging effect to reduce electrostatic force of the second portions 120a, and are appropriately positioned to prevent the stiction between the MEMS devices 130 and the second portions 120a. To release charge, the bumps 140 may include a conductive layer, e.g., metal.

The anti-stiction layer 150 has anti-stiction properties of hydrophobic and/or low adhesion force, and can prevent the MEMS device 130 from sticking on the second substrate 120 during the usage of the semiconductor structure 100 (in-use stiction). Further, the material of the anti-stiction layer 150 is high thermo resistant, and thus can keep the anti-stiction properties after undergoing thermo processes, such as bonding process (e.g. eutectic bonding) and packaging process (e.g. vacuum packaging).

Figure 2B:
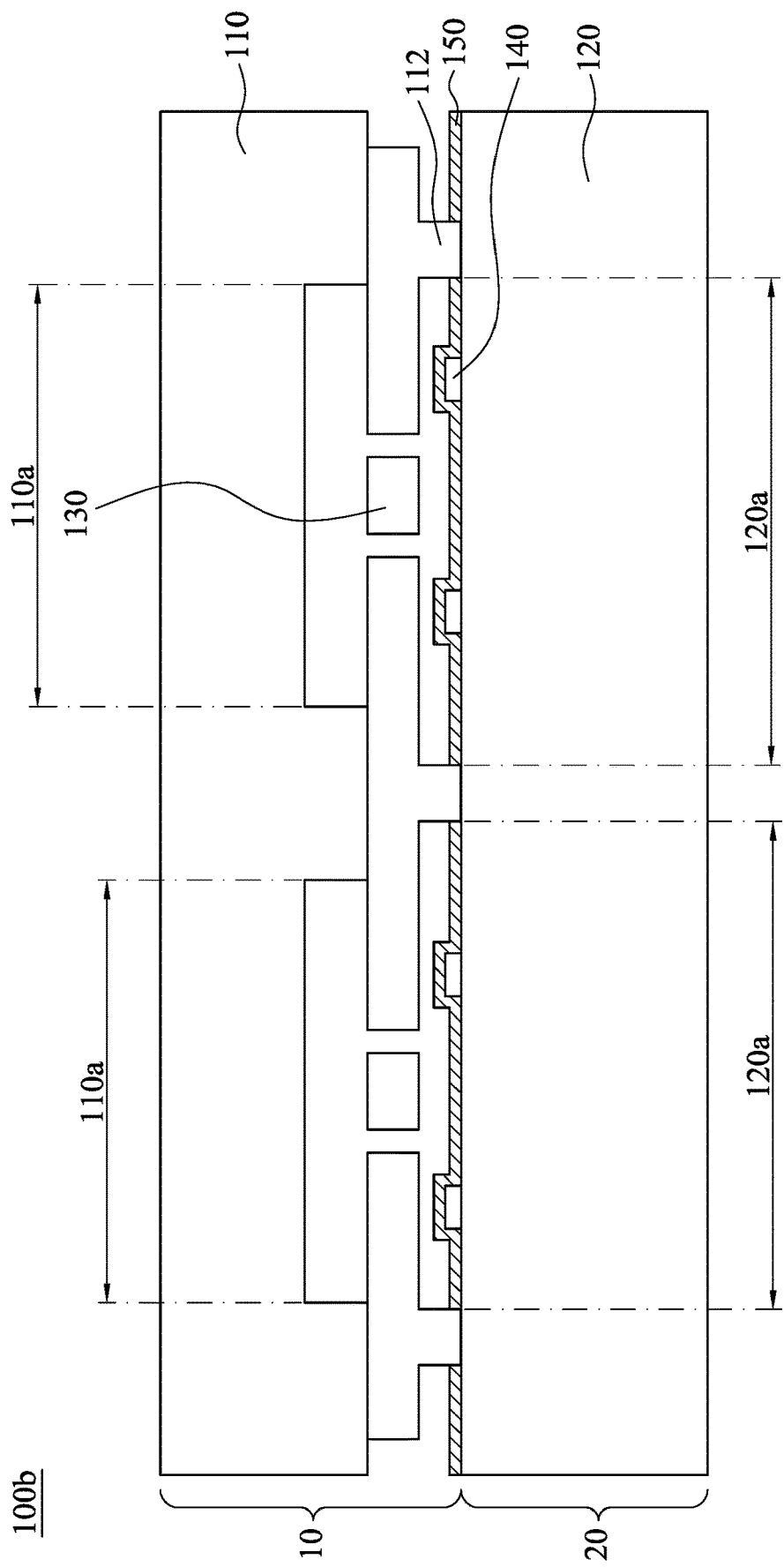
FIG. 2B is a schematic cross-sectional view of a semiconductor structure in accordance with some embodiments.

As shown in FIG. 2A, the anti-stiction layer 150 of the semiconductor structure 100a is on a surface of the MEMS device 130 facing toward the second portion 120a. In other embodiments, the anti-stiction layer 150 is on the second portion 120a as the semiconductor structure 100b shown in FIG. 2B. In other embodiments, the anti-stiction layers 150a and 150b are on the surface of the MEMS device 130 facing toward the second portion 120a and the second portion 120a as the semiconductor structure 100c shown in FIG. 2C. The differences between the semiconductor structure 100a, the semiconductor structure 100b, and the semiconductor structure 100c are the position of the anti-stiction layer. These differences do not affect the function of each element in the embodiments, and thus the semiconductor structure 100b and the semiconductor structure 100c have the same functions and advantages as the semiconductor structure 100a.

It is noteworthy that the semiconductor structure of the present disclosure may include an anti-stiction layer and a self-assembled monolayers (SAM) coating simultaneously, wherein the anti-stiction layer is on a surface of the MEMS device facing toward the second substrate, and the SAM coating is on a surface of the second substrate facing toward the MEMS device. This kind of semiconductor structure may include the structure of the semiconductor structure 100c shown in FIG. 2C. Therefore, the semiconductor structure 100c may include a first substrate 110, a second substrate 120 bonded with the first substrate 110 through bond rings 112, MEMS devices 130 between first portions 110a and second portions 120a, bump structures 140 on the second portions 120a, an anti-stiction layer 150a on surfaces of the MEMS devices 130, and a SAM coating 150b on the second portions 120a. Although the anti-stiction properties of the SAM coating 150b may degrade after thermo processes, the SAM coating 150b may still reduce some capillary force of the second portions 120a to prevent the stiction of the MEMS device 130.

Figure 3:
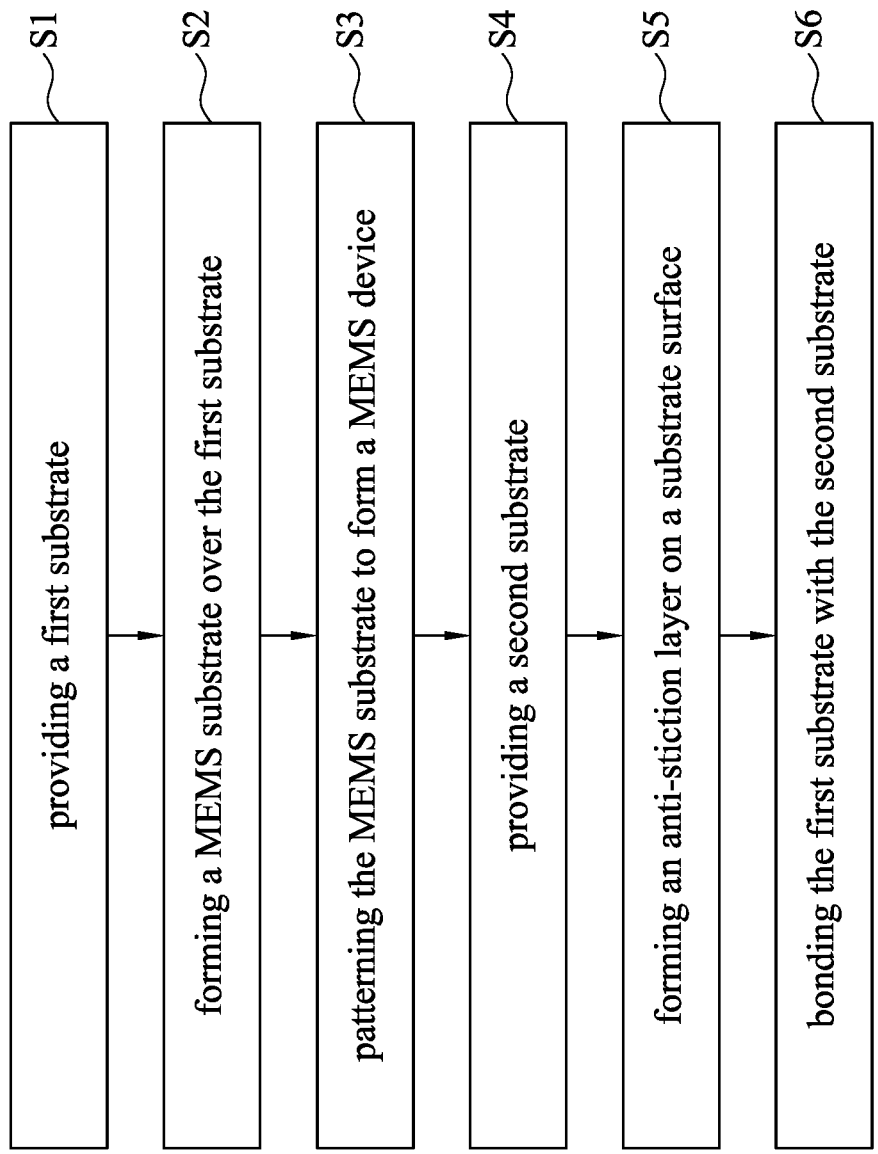
FIG. 3 is a flow chart illustrating a method for fabricating a semiconductor structure in accordance with some embodiments.

Referring to FIG. 3, which is a flow chart illustrating a method for fabricating a semiconductor structure in accordance with some embodiments. In embodiments, the semiconductor structure is a MEMS structure.

In operation S1, a first substrate is provided. The specific features of the first substrate 110 may be referred to those exemplified for the first substrate 110 of FIG. 2A.

In operation S2, a MEMS substrate is formed over the first substrate. The MEMS substrate may have the same specific features as the first substrate, which can be referred to those exemplified for the first substrate 110 of FIG. 2A. In some embodiments, the MEMS substrate is made of silicon.

In operation S3, the MEMS substrate is patterned to form the MEMS device. The MEMS substrate may be patterned by etching. The specific features of the MEMS device may be referred to those exemplified for the MEMS device 130 of FIG. 1.

In operation S4, a second substrate is provided. The second substrate may include a bump structure on a surface of the second substrate that is configured to face toward the MEMS device. The specific features of the second substrate and the bump structure may be referred to those exemplified for the second substrate 120 and the bump structure 140 of FIG. 2A.

In operation S5, an anti-stiction layer is formed on a surface. In some embodiments, the anti-stiction layer is formed on a surface of the MEMS device facing toward the second substrate to form the semiconductor structure 100a shown in FIG. 2A. In other embodiments, the anti-stiction layer is formed on a surface of the second substrate facing toward the MEMS device, i.e. the second portion 120a, to form the semiconductor structure 100b shown in FIG. 2B. In yet other embodiments, the anti-stiction layer is formed on a surface of both of the MEMS device facing toward the second substrate and the second substrate facing toward the MEMS device, i.e. the second portion 120a, to form the semiconductor structure 100c shown in FIG. 2C. The anti-stiction layer includes amorphous carbon (α-carbon), polytetrafluoroethene (Teflon), hafnium oxide ($HfO_2$), tantalum oxide ($Ta_2O_5$), zirconium oxide ($ZrO_2$), or a combination thereof. The specific features of the anti-stiction layer may be referred to those exemplified for the anti-stiction layer 150 of FIG. 1 and FIG. 2A.

In operation S6, the first substrate is bonded with the second substrate. The first substrate and the second substrate may be bonded by any suitable processes, such as eutectic bonding, thermal compression bonding, and adhesive bonding.

In some embodiments, the first substrate and the second substrate are bonded by eutectic bonding. The method for fabricating the semiconductor structure further includes forming a bond ring over the first substrate to bond with the second substrate. The bond ring may be formed by etching the MEMS substrate to form a bond anchor over the first substrate. Then, a metallic layer is deposited over the bond anchor to form the bond ring.

It is noteworthy that the foregoing operating sequences for the method for fabricating the semiconductor structure shown in FIG. 3 are merely examples and are not intended to be limiting, and various changes, substitutions, and alterations may be made without departing from the spirit and scope of the present disclosure.

In some embodiments, the anti-stiction layer is formed on the surface of the MEMS device facing toward the second substrate. The method for fabricating the semiconductor structure starts with operation S1 to provide a first substrate. The method continues with operation S2 to form a MEMS substrate over the first substrate. Next, an anti-stiction layer is formed on a portion of the MEMS substrate, i.e. operation S5. Then, the MEMS substrate is patterned to leave a portion of the MEMS substrate covered by the anti-stiction layer, and to form a MEMS device, i.e. operation S3. The method continues with operation S4 to provide a second substrate with a bump structure thereon. Then, the first substrate is bonded with the second substrate, i.e. operation S6.

In other embodiments, the anti-stiction layer is formed on the surface of the second substrate facing toward the MEMS device. The method for fabricating the semiconductor structure starts with operation S1 to provide a first substrate. The method continues with forming a MEMS substrate over the first substrate, and patterning the MEMS substrate to form a MEMS device, i.e. operations S2 and S3. Next, a second substrate with a bump structure thereon is provided, i.e. operation S4. The method continues with operation S5 to form an anti-stiction layer on a surface of the second substrate, which is configured to face toward the MEMS device. Then, the first substrate is bonded with the second substrate, i.e. operation S6.

In yet other embodiments, the anti-stiction layers are formed on the surface of both of the MEMS device facing toward the second substrate and the second substrate facing toward the MEMS device. The method for fabricating the semiconductor structure starts with operation S1 to provide a first substrate. The method continues with operation S2 to form a MEMS substrate over the first substrate. Next, an anti-stiction layer is formed on a portion of the MEMS substrate, i.e. operation S5. Then, the MEMS substrate is patterned to leave a portion of the MEMS substrate covered by the anti-stiction layer, and to form a MEMS device, i.e. operation S3. The method continues with operation S4 to provide a second substrate with a bump structure thereon. Next, another anti-stiction layer is formed on a surface of the second substrate, which is configured to face toward the MEMS device in the subsequent bonding process, i.e. operation S5. Then, the first substrate is bonded with the second substrate, i.e. operation S6.

In some embodiments, the method for fabricating the semiconductor structure further includes forming a self-assembled monolayers (SAM) coating on a portion of the second substrate. The method for fabricating the semiconductor structure for the embodiments starts with operation S1 to provide a first substrate. The method continues with operation S2 to form a MEMS substrate over the first substrate. Next, an anti-stiction layer is formed on a portion of the MEMS substrate, i.e. operation S5. Then, the MEMS substrate is patterned to leave a portion of the MEMS substrate covered by the anti-stiction layer, and to form a MEMS device, i.e. operation S3. The method continues with operation S4 to provide a second substrate with a bump structure thereon. Next, the SAM coating is formed on the portion of the second substrate, which is configured to face toward the MEMS device in the subsequent bonding process, i.e. operation S5. Then, the first substrate is bonded with the second substrate, i.e. operation S6. Although the anti-stiction properties of the SAM coating may degrade after thermo processes, the SAM coating may still reduce some capillary force of the surface of the second substrate to prevent the stiction of the MEMS device.

FIGS. 4A through 4J are cross-sectional views at various stages of manufacturing a semiconductor structure 200 in accordance with some embodiments. It should be understood that FIGS. 4A through 4J are illustrative only and not intended to be limiting. In embodiments, the semiconductor structure 200 is a MEMS structure.

Figure 4A:
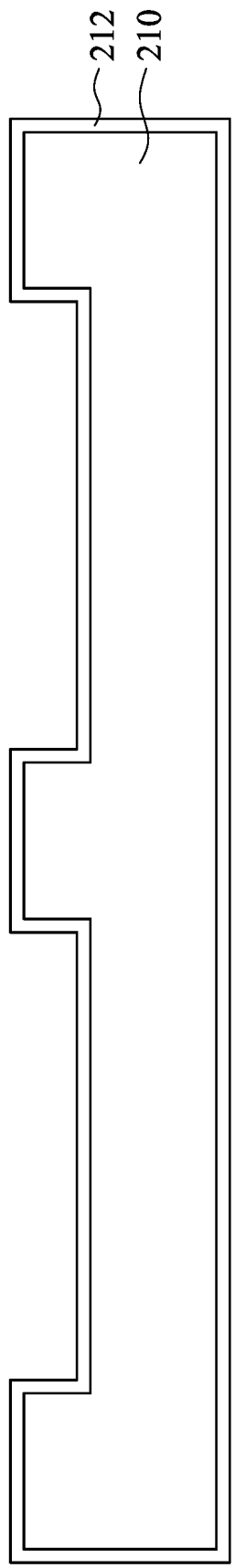
FIGS. 4A through 4J are cross-sectional views at various stages of manufacturing a semiconductor structure in accordance with some embodiments.

Referring to FIG. 4A, a first substrate 210 is provided, i.e. operation S1, and the first substrate 210 includes a recess. An oxide layer 212 is deposited around the first substrate 210. In other embodiments, the oxide layer is deposited on the upper surface of the first substrate 210.

Figure 4B:
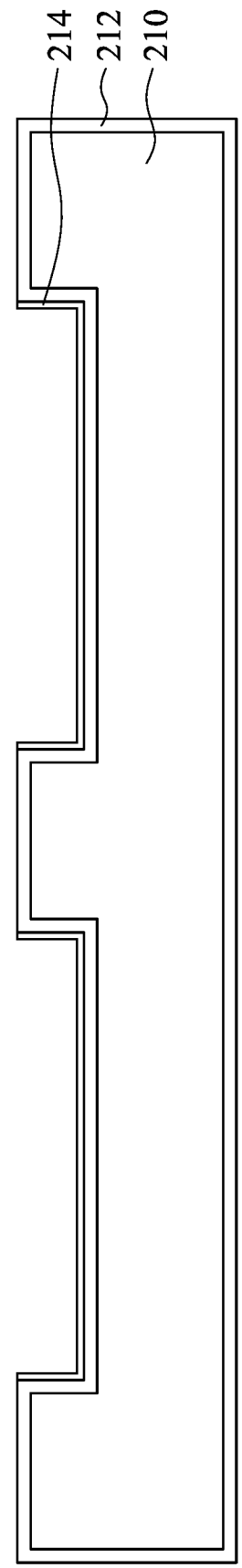

Referring to FIG. 4B, an etch stop layer 214 is formed on the recess of the first substrate 210. In some embodiments, the etch stop layer 214 is vapor hydrogen fluoride (HF) stop layer, and is made of $Al_2O_3$, and has a thickness of 100-2000 Ångström (Å). The etch stop layer 214 may be formed by depositing an etch stop material over the oxide layer 212, and etching the etch stop material to form the etch stop layer 214 in the recess of the first substrate 210, and to expose a portion of the oxide layer 212 as a bonding surface for the subsequent processes.

Figure 4C:
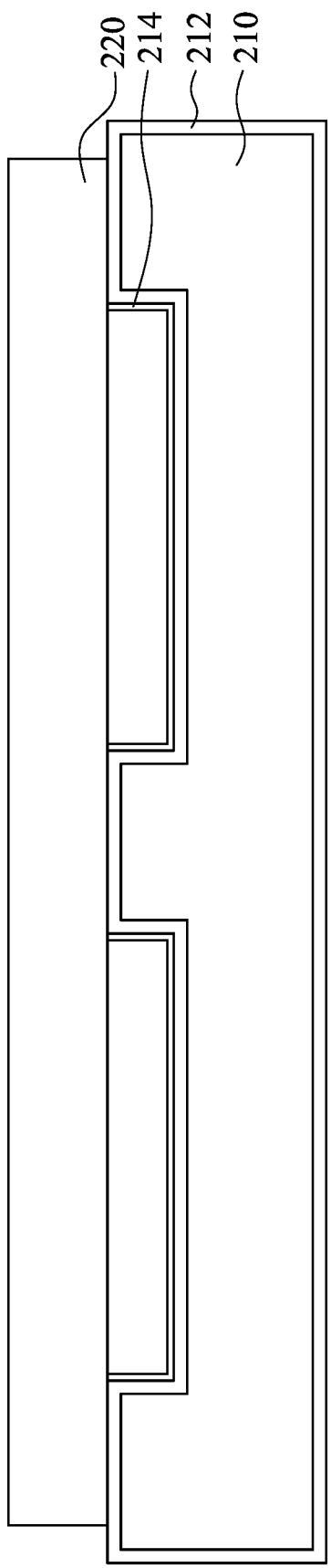

Referring to FIG. 4C, a MEMS substrate 220 is formed over the first substrate 210 to bond with the exposed oxide layer 212, i.e. operation S2.

Figure 4D:
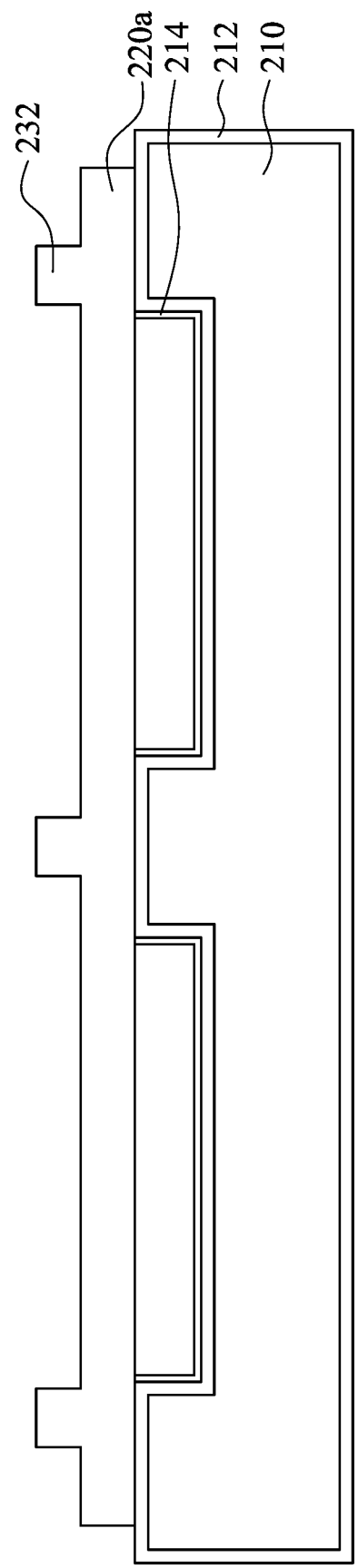
Figure 4E:
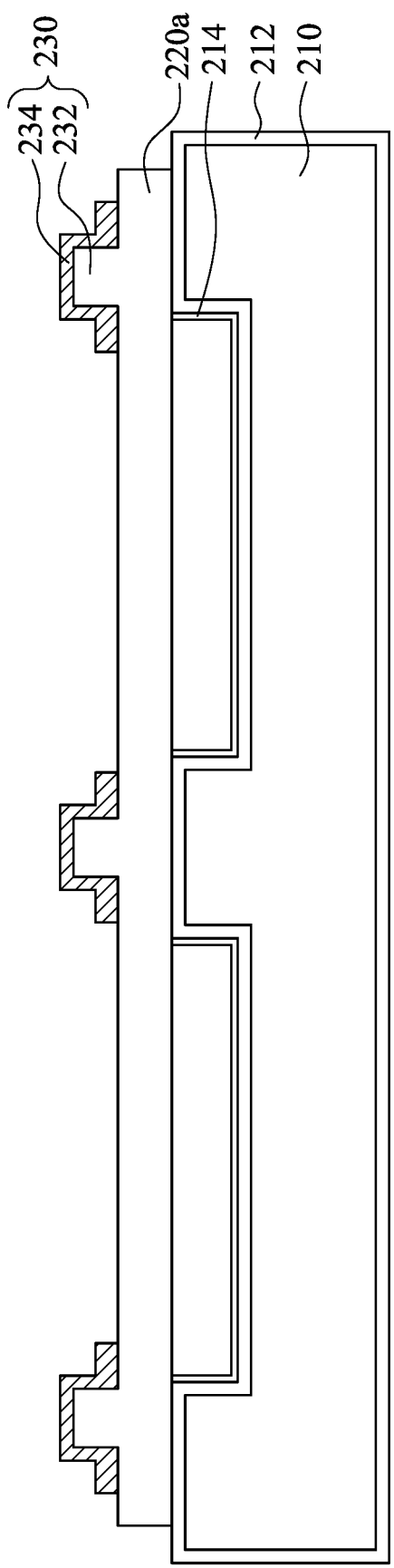

Referring to FIG. 4D, the MEMS substrate 220 is etched to form bond anchors 232 over the first substrate 210. Then, a first metallic layer 234 is deposited over the bond anchors 232 to form bond rings 230 as shown in FIG. 4E. In some embodiments, the first metallic layer 234 is made of germanium (Ge), and has a thickness of 1000 Å-1 μm.

Figure 4F:
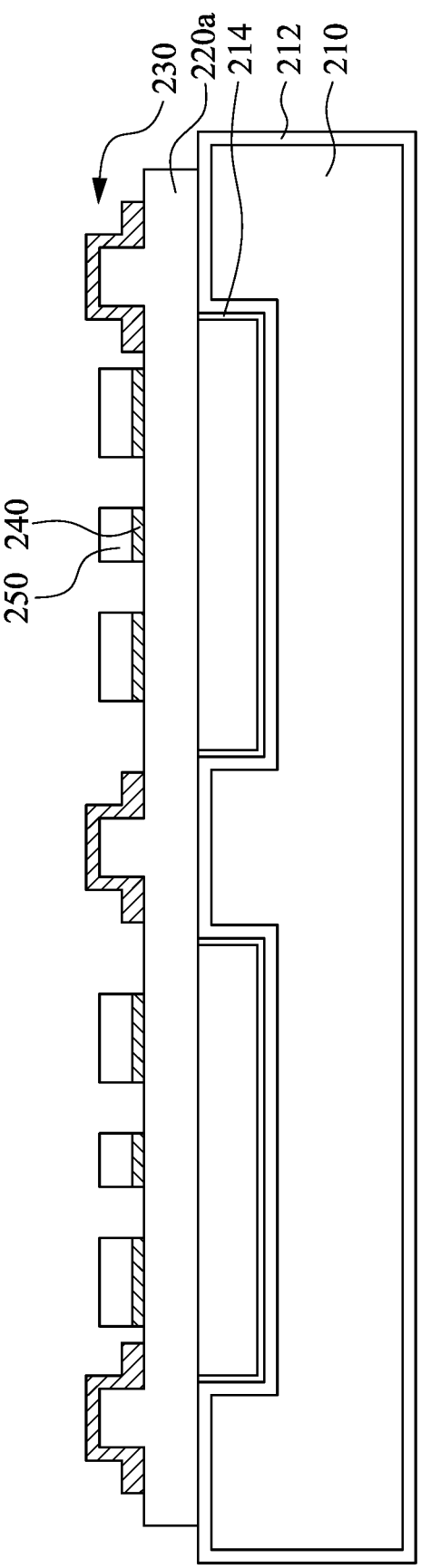

Referring to FIG. 4F, an anti-stiction layer 240 and a hard mask 250 are formed on portions of the MEMS substrate 220a, i.e. operation S5. In some embodiments, the anti-stiction layer 240 includes amorphous carbon, and has a thickness of 100 Å-3 μm. In some embodiments, the hard mask 250 is made of oxide, such as $SiO_2$, and has a thickness of 100 Å-3 μm. The anti-stiction layer 240 and the hard mask 250 may be formed by depositing an anti-stiction material over the MEMS substrate 220a, and forming a hard mask material over the anti-stiction material. Then, the hard mask material is patterned to form the hard mask 250, and the anti-stiction material is patterned to form the anti-stiction layer 240. In some embodiments, the anti-stiction material is patterned by $O_2$ ashing.

Figure 4G:
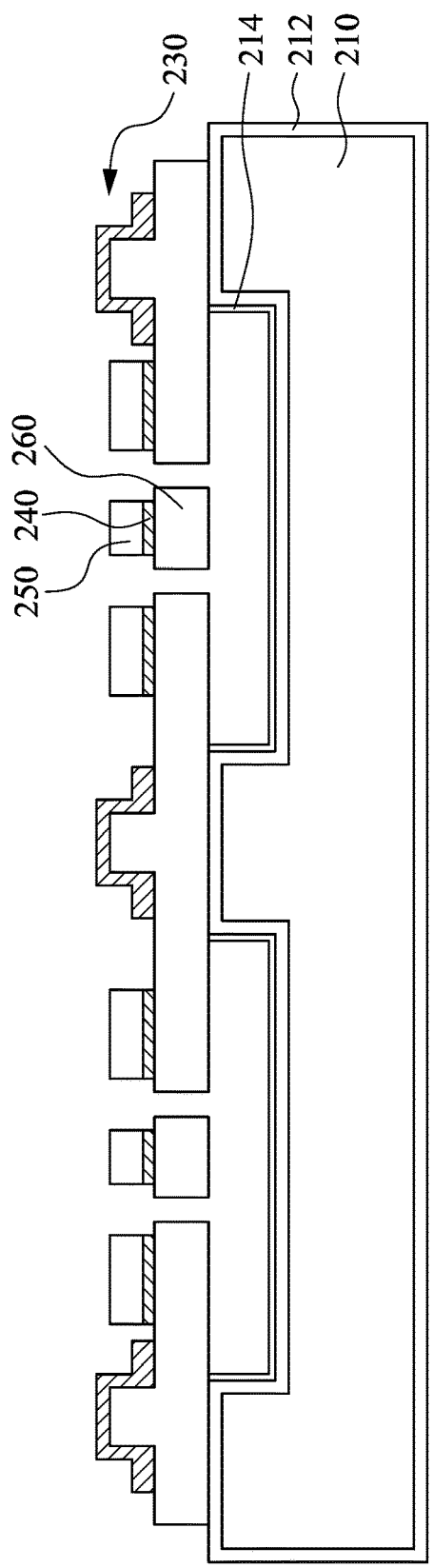
Figure 4H:
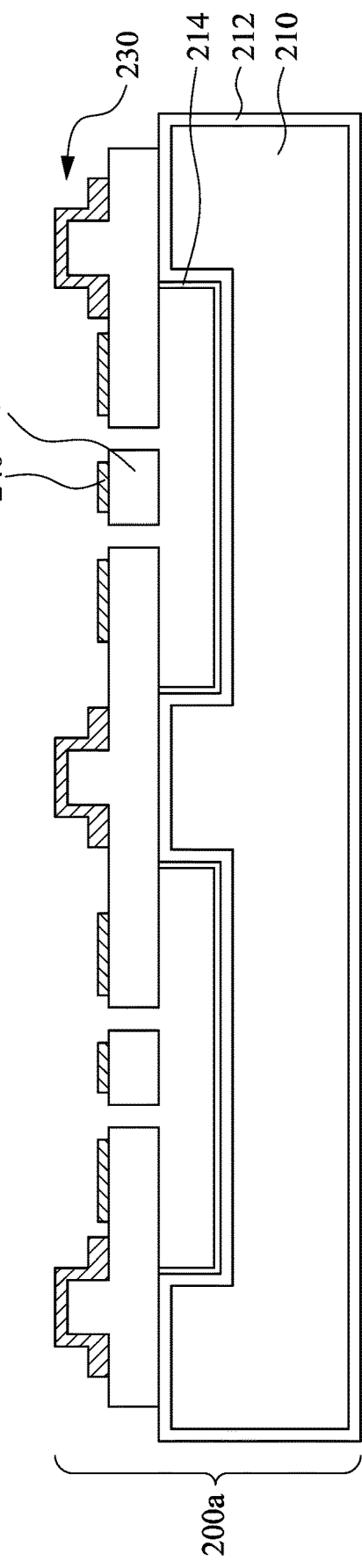

Referring to FIG. 4G, the MEMS substrate 220a is patterned to leave the MEMS substrate 220a that is covered by the anti-stiction layer 240 and the hard mask 250, and to form MEMS devices 260, i.e. operation S3. Then, the hard mask 250 is removed as shown in FIG. 4H, and a substrate structure 200a for the semiconductor structure 200 is thus obtained. In some embodiments, the hard mask 250 is removed by dry etching, such as vapor hydrogen fluoride etching.

Figure 4I:
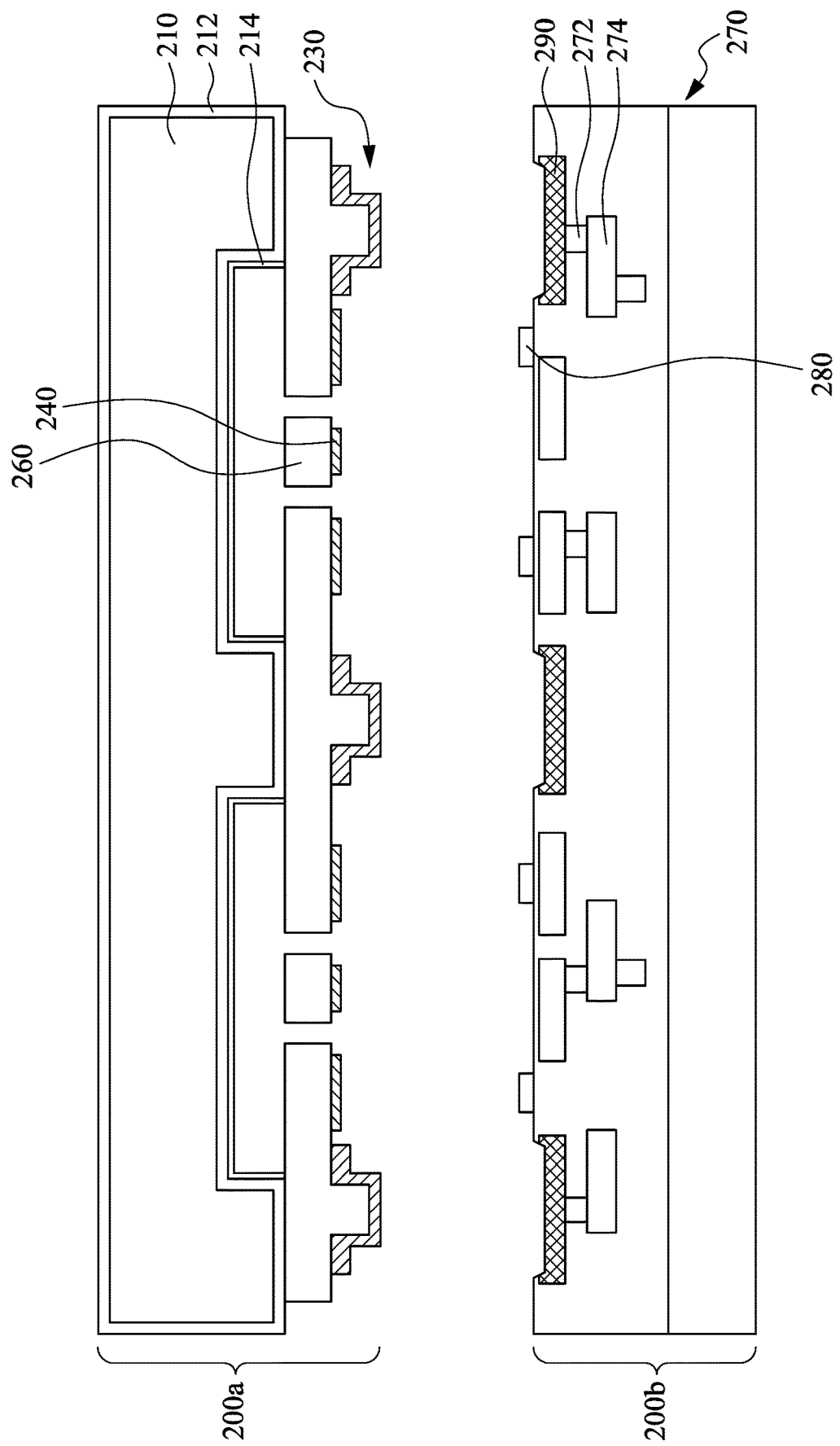

Referring to FIG. 4I, a cap structure 200b for the semiconductor structure 200 is provided, i.e. operation S4. The cap structure 200b includes a second substrate 270, bump structures 280, and bond pads 290. The second substrate 270 includes a plurality of vertical conductive features 272 and a plurality of horizontal conductive features 274. The bump structures 280 are on the second substrate 270, and are configured to face toward the MEMS devices 260. The bond pads 290 are on the second substrate 270.

The second substrate 270 may include any suitable materials, and the specific features can be referred to those exemplified for the second substrate 120 of FIG. 2A. In some embodiments, the second substrate 270 includes CMOS, and the vertical conductive features 272 may be contacts or vias, and the horizontal conductive features 274 may be metal lines or sensing plates. The contact is configured to connect metal lines with the substrate, and the via is configured to connect metal lines.

In some embodiments, the bond pad 290 includes a second metallic layer, and the second metallic layer is made of aluminum copper (AlCu).

Figure 4J:
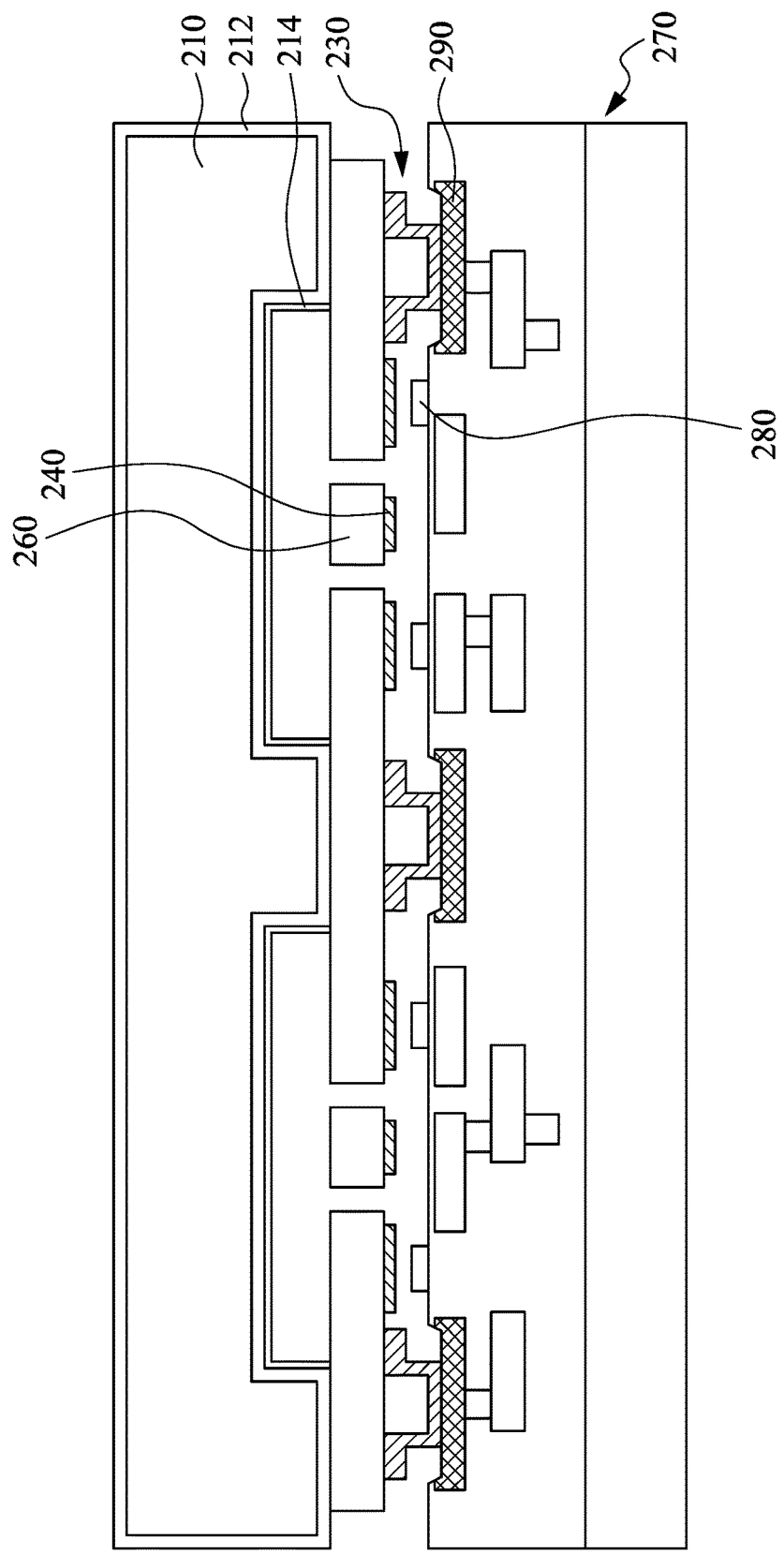

Referring to FIG. 4J, the first substrate 210 is bonded with the second substrate 270 through the bond rings 230 and the bond pads 290 to form the semiconductor structure 200, i.e. operation S6. The first substrate 210 and the second substrate 270 may be bonded by any suitable processes, such as eutectic bonding, thermal compression bonding, and adhesive bonding. In some embodiments, the bond rings 230 include the first metallic layer 234, which is made of Ge, the bond pads 290 include the second metallic layer, which is made of AlCu, and the first substrate 210 and the second substrate 270 is bonded by eutectic bonding.

The semiconductor structure 200 fabricated by the method shown in FIGS. 4A through 4J includes the anti-stiction layer 240 on the surface of the MEMS device 260 facing toward the second substrate 270, which can still has the anti-stiction properties after thermo processes, such as eutectic bonding and packaging, due to its high thermo resistance. Therefore, the anti-stiction layer 240 can prevent the MEMS device 260 of the semiconductor structure 200 from sticking on the second substrate 270.

FIGS. 5A through 5I are cross-sectional views at various stages of manufacturing a semiconductor structure 300 in accordance with some embodiments. It should be understood that FIGS. 5A through 5I are illustrative only and not intended to be limiting. In embodiments, the semiconductor structure 300 is a MEMS structure.

Figure 5A:
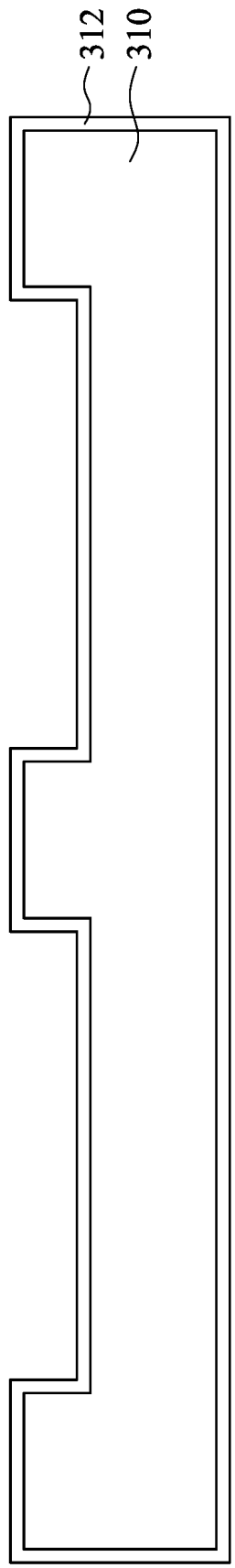
Figure 5B:
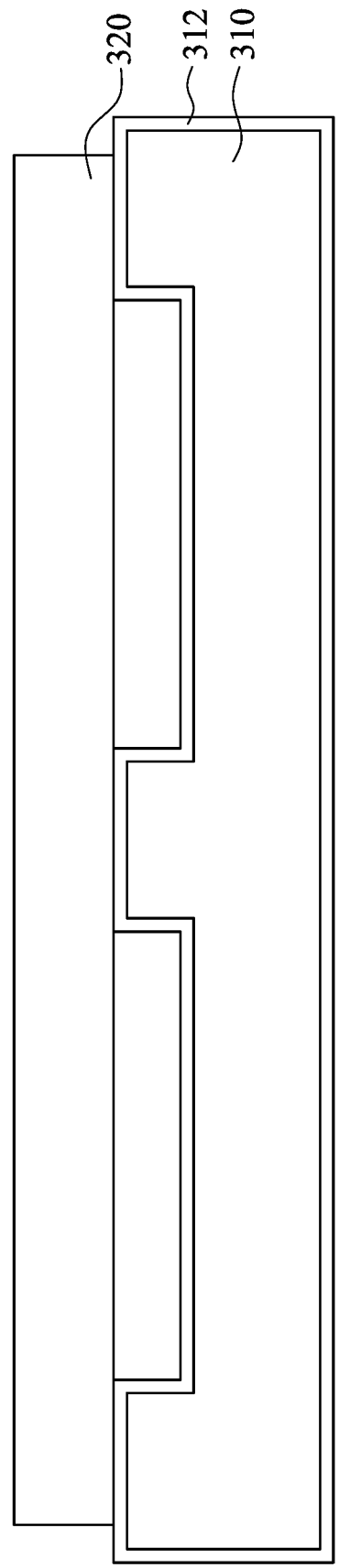

Referring to FIG. 5A, a first substrate 310 is provided with an oxide layer 212 deposited around the first substrate 310. Then, a MEMS substrate 320 is formed over the first substrate 310 as shown in FIG. 5B.

Figure 5C:
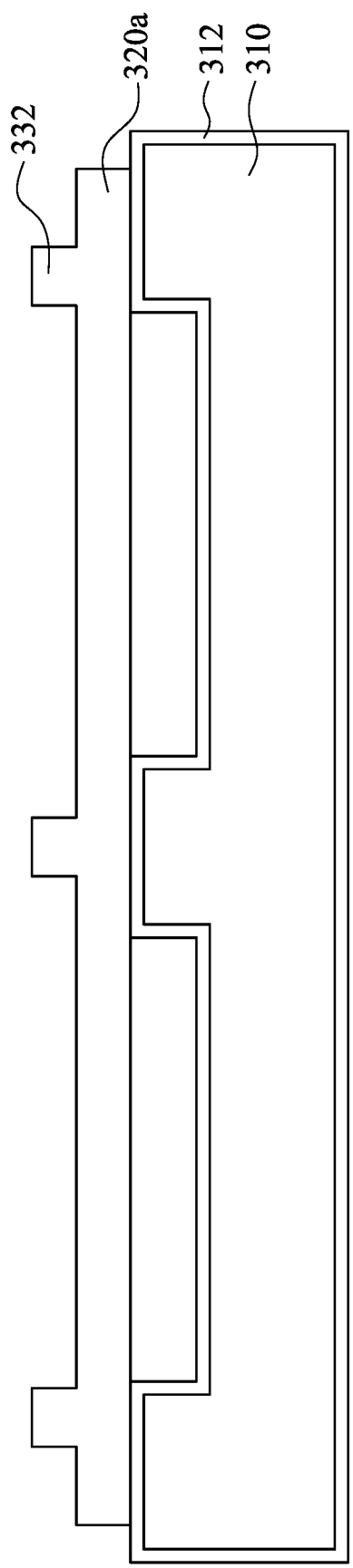
Figure 5D:
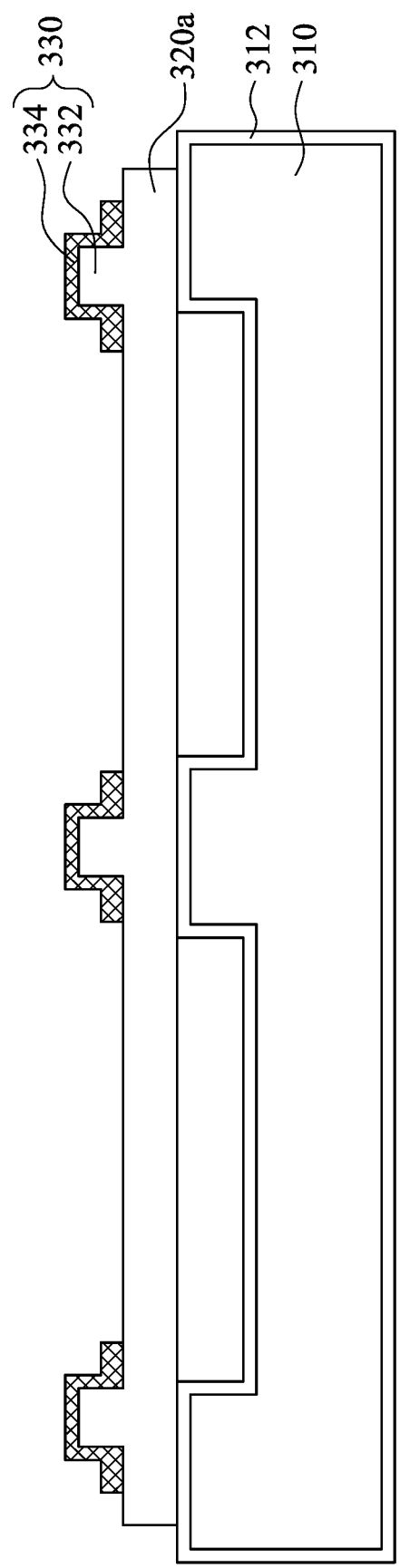

Referring to FIG. 5C, the MEMS substrate 320 is etched to form bond anchors 332 over the first substrate 310. Then, a first metallic layer 334 is deposited over the bond anchors 332 to form bond rings 330 as shown in FIG. 5D. In some embodiments, the first metallic layer 334 is made of AlCu, and has a thickness of 1000 Å-1 µm.

Figure 5E:
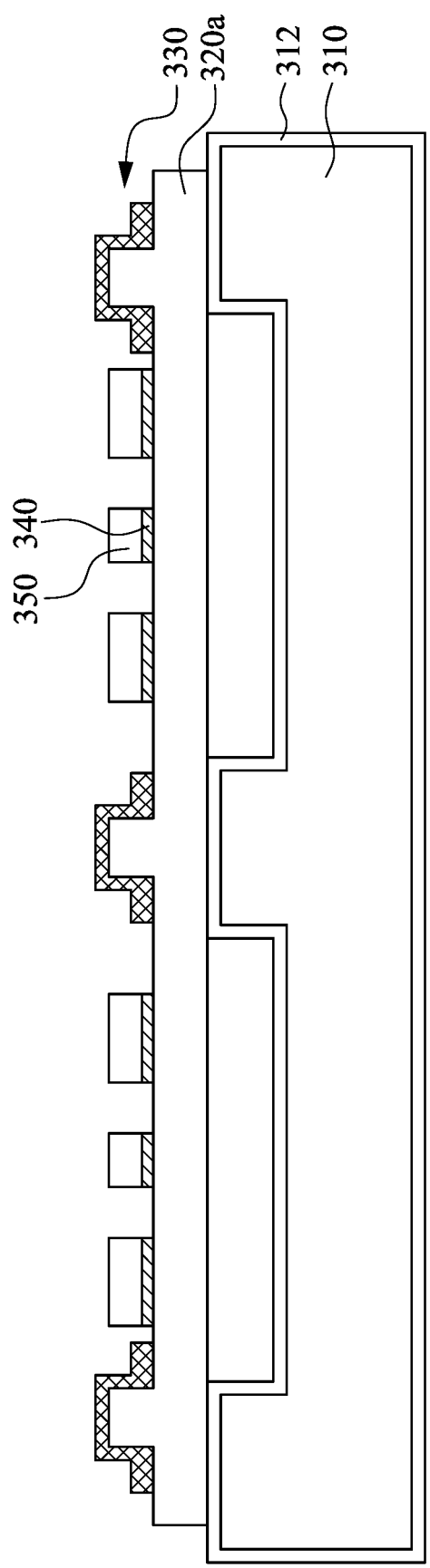

Referring to FIG. 5E, an anti-stiction layer 340 and a hard mask 350 are formed on portions of the MEMS substrate 320a. In some embodiments, the anti-stiction layer 340 includes amorphous carbon, and has a thickness of 1000 Å-3 µm. In some embodiments, the hard mask 350 is made of oxide, and has a thickness of 1000 Å-3 µm. The anti-stiction layer 340 and the hard mask 350 may be formed by any suitable processes, such as the exemplified processes for forming the anti-stiction layer 240 and the hard mask 250 of FIG. 4F.

Figure 5F:
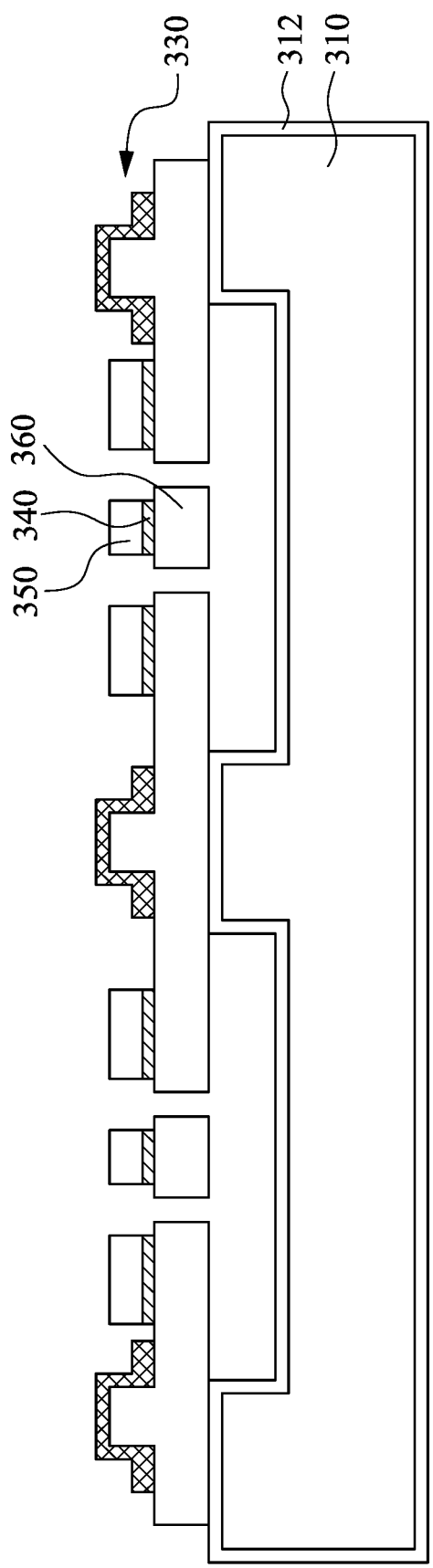

Referring to FIG. 5F, the MEMS substrate 320a is patterned to leave the MEMS substrate 320a that is covered by the anti-stiction layer 340 and the hard mask 350, and to form MEMS devices 360. Then, the hard mask 350 is removed as shown in FIG. 5G, and a substrate structure 300a for the semiconductor structure 300 is thus obtained. In some embodiments, the hard mask 350 is removed by oxide etching back.

Referring to FIG. 5H, a cap structure 300b for the semiconductor structure 300 is provided. The cap structure 300b includes a second substrate 370, bump structures 380, and bond pads 390. The second substrate 370 includes a plurality of vertical conductive features 372 and a plurality of horizontal conductive features 374. The bump structures 380 are on the second substrate 370, and are configured to face toward the MEMS devices 360 in the subsequent bonding process. The bond pads 390 are on the second substrate 370, and each of the bond pads 390 include a second metallic layer 392 and a third metallic layer 394 over the second metallic layer 392. In some embodiments, the second metallic layer 392 is made of a material that is the same as the first metallic layer 334, such as AlCu, and the third metallic layer 394 is made of a material different from that of the first metallic layer 334 and the second metallic layer 392, such as Ge.

In some embodiments, the second substrate 370 includes CMOS, and the vertical conductive features 372 may be contacts or vias, and the horizontal conductive features 374 may be metal lines or sensing plates.

Figure 5I:
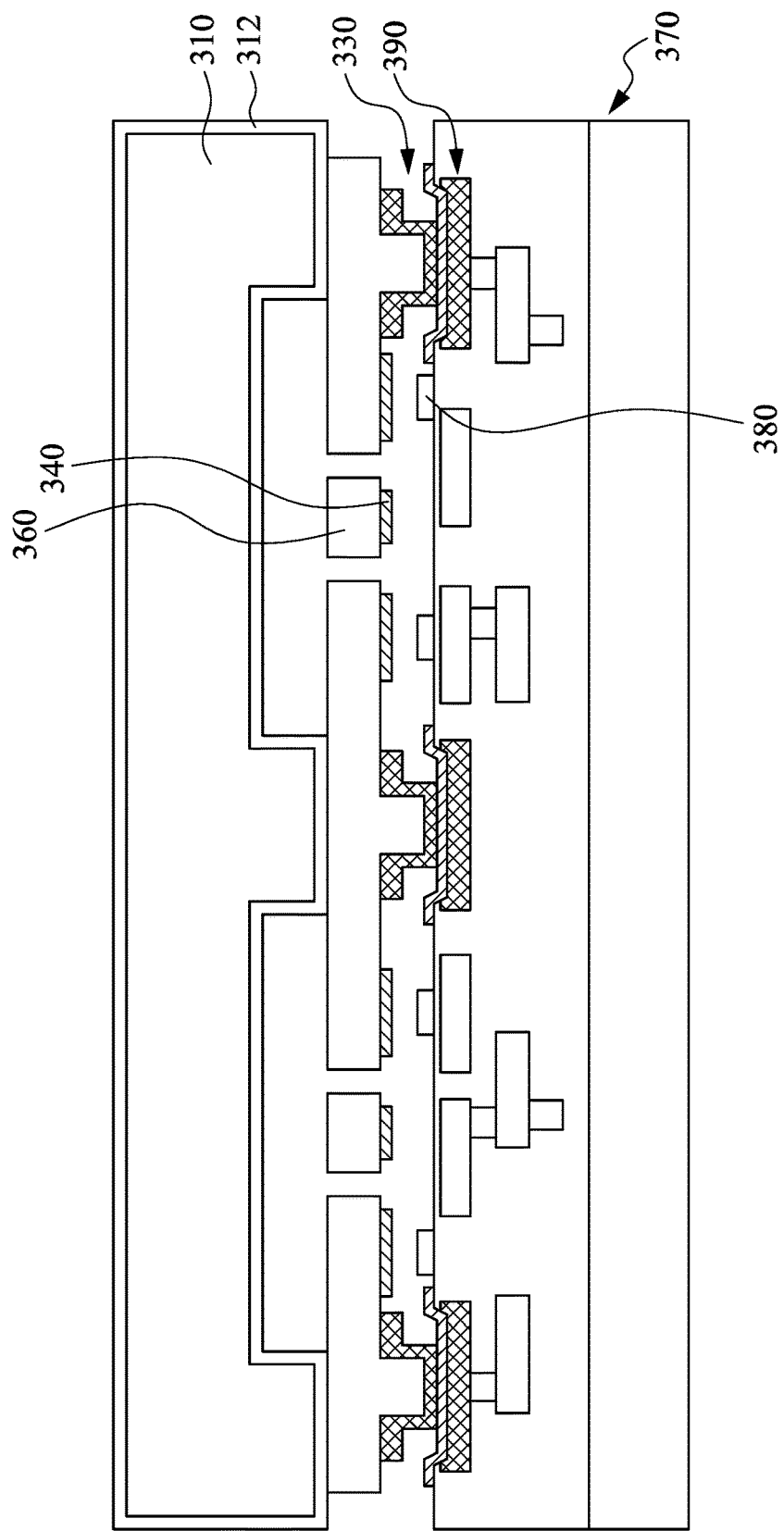

Referring to FIG. 5I, the first substrate 310 is bonded with the second substrate 370 through the bond rings 330 and the bond pads 390 to form the semiconductor structure 300. The first substrate 310 and the second substrate 370 may be bonded by any suitable processes, such as eutectic bonding, thermal compression bonding, and adhesive bonding. In some embodiments, the bond rings 330 include the first metallic layer 334, which is made of AlCu, the bond pads 390 include the second metallic layer 392 and the third metallic layer 394, which is made of Ge and AlCu respectively, and the first substrate 310 and the second substrate 370 is bonded by eutectic bonding.

The difference between the fabricating methods shown in FIGS. 5A through 5I and FIGS. 4A through 4J is the bonding medium for eutectic bonding. The fabricating method shown in FIGS. 4A through 4J applies two metallic layers made of two different materials, i.e. the first metallic layer 234 and the second metallic layer, as the bonding medium, while the fabricating method shown in FIGS. 5A through 5I applies three metallic layers made of two different materials, i.e. the first metallic layer 234, the second metallic layer 392, and the third metallic layer 394, as the bonding medium. This difference does not affect the functions of each component in the embodiment. Therefore, the semiconductor structure 300 has the same functions and advantages as the semiconductor structure 200.

FIGS. 6A through 6I are cross-sectional views at various stages of manufacturing a semiconductor structure 400 in accordance with some embodiments. It should be understood that FIGS. 6A through 6I are illustrative only and not intended to be limiting. In embodiments, the semiconductor structure 400 is a MEMS structure.

Figure 6A:
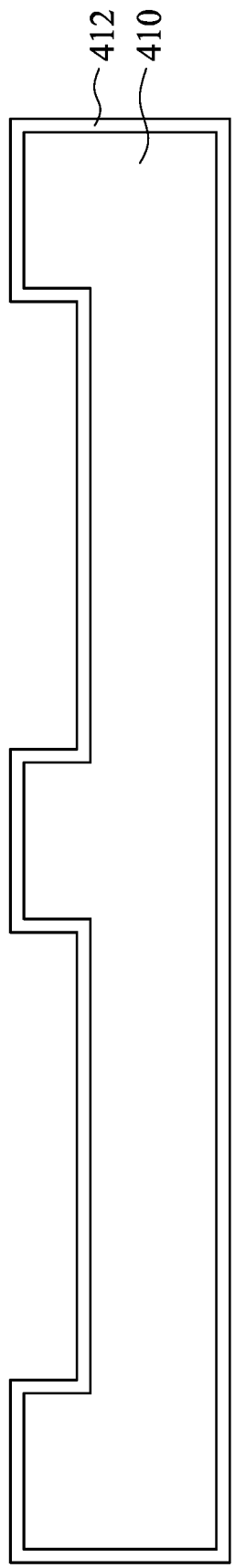
Figure 6B:
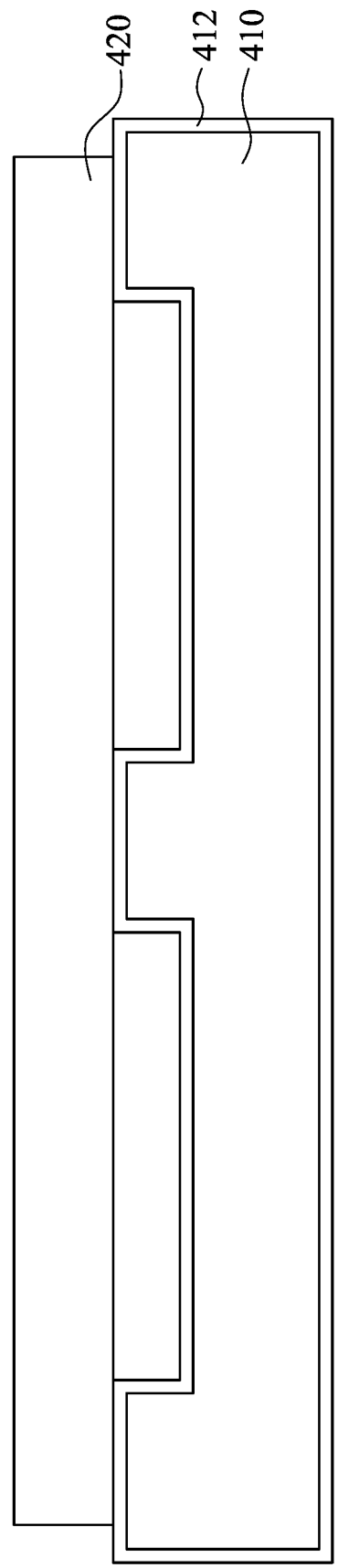

Referring to FIG. 6A, a first substrate 410 is provided with an oxide layer 412 deposited around the first substrate 410. Then, a MEMS substrate 420 is formed over the first substrate 410 as shown in FIG. 6B.

Referring to FIG. 6C, the MEMS substrate 420 is etched to form bond anchors 432 over the first substrate 410. Then, a first metallic layer 434 is deposited over the bond anchors 432 to form bond rings 430 as shown in FIG. 6D. In some embodiments, the first metallic layer 434 is made of Ge, and has a thickness of 1000 Å-1 µm.

Figure 6E:
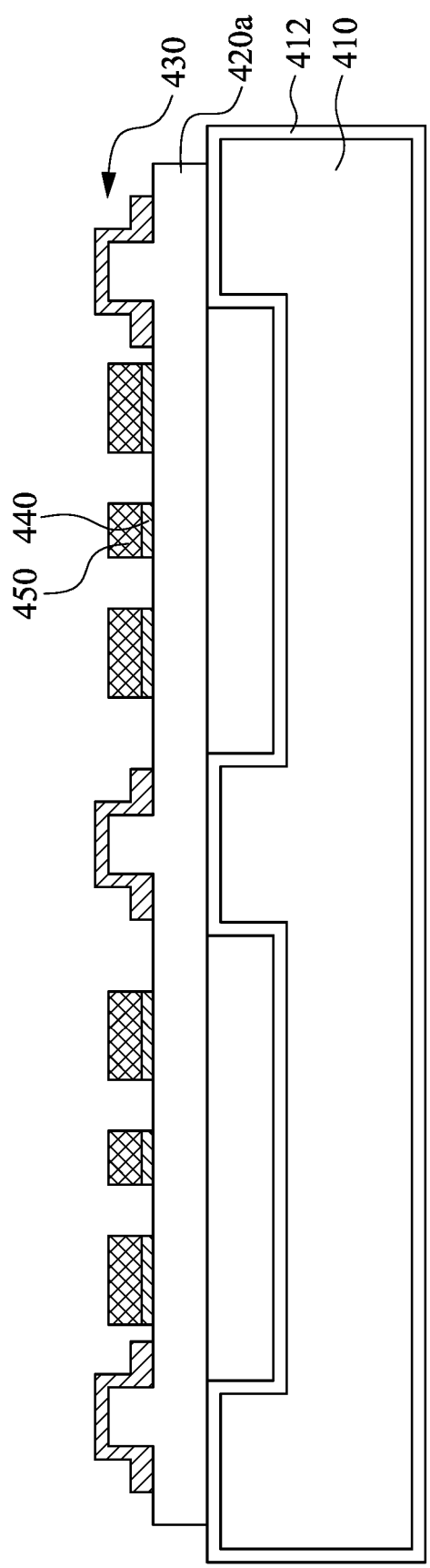

Referring to FIG. 6E, an anti-stiction layer 440 and a hard mask 450 are formed on portions of the MEMS substrate 420a. In some embodiments, the anti-stiction layer 440 includes amorphous carbon, and has a thickness of 1000 Å-3 µm. In some embodiments, the hard mask 450 is made of metal, such as AlCu, and has a thickness of 1000 Å-3 µm. The anti-stiction layer 440 and the hard mask 450 may be formed by any suitable processes, such as the exemplified processes for forming the anti-stiction layer 240 and the hard mask 250 of FIG. 4F.

Figure 6F:
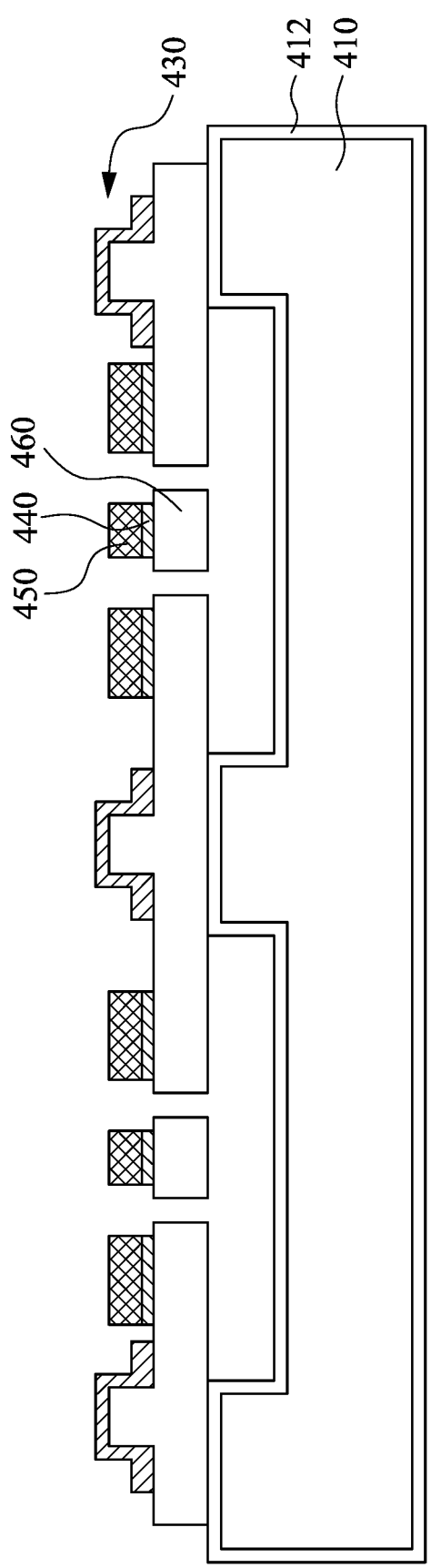
Figure 6G:
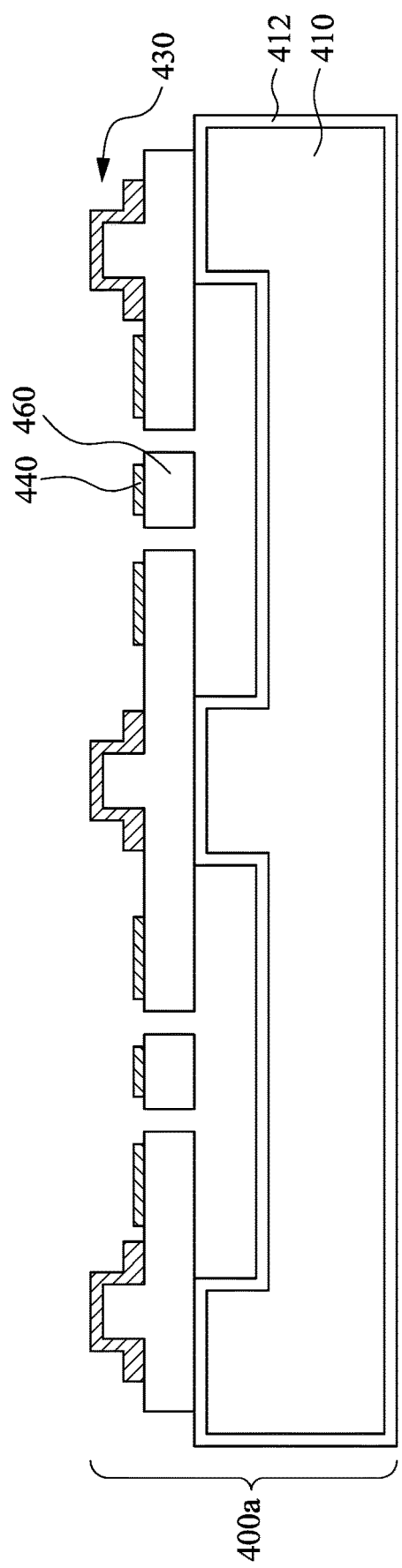

Referring to FIG. 6F, the MEMS substrate 420a is patterned to leave the MEMS substrate 420a that is covered by the anti-stiction layer 440 and the hard mask 450, and to form MEMS devices 460. Then, the hard mask 450 is removed as shown in FIG. 6G, and a substrate structure 400a for the semiconductor structure 400 is thus obtained. In some embodiments, the hard mask 450 is removed by wet etching, such as acid etching using M2 acid ($HNO_3$+$CH_3COOH$+$H_3PO_4$), or diluted HF.

Figure 6H:
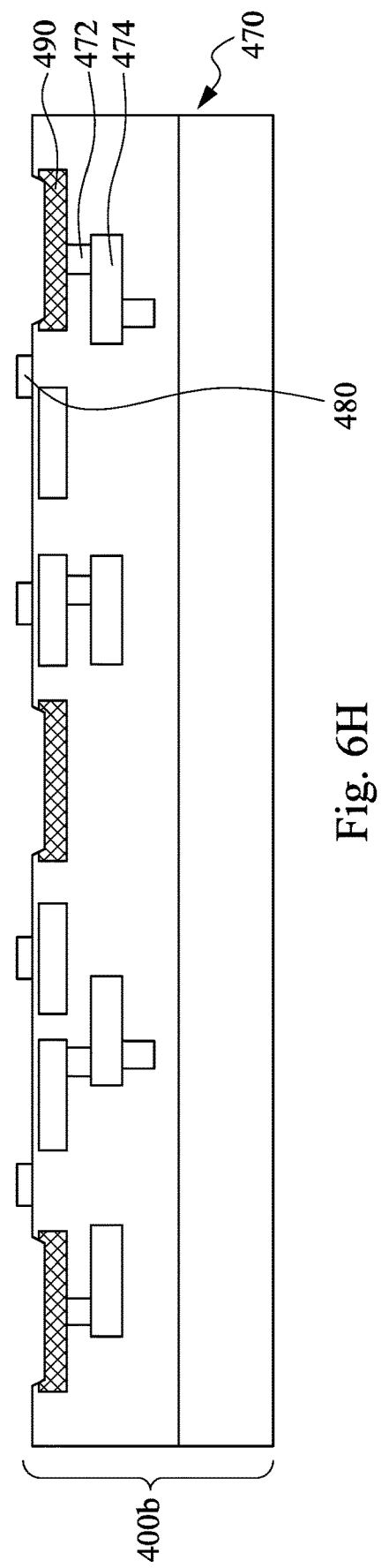

Referring to FIG. 6H, a cap structure 400b for the semiconductor structure 400 is provided. The cap structure 400b includes a second substrate 470, bump structures 480, and bond pads 490. The second substrate 470 includes a plurality of vertical conductive features 472 and a plurality of horizontal conductive features 474. The bump structures 480 are on the second substrate 470, and are configured to face toward the MEMS devices 460 in the subsequent bonding process. The bond pads 490 are on the second substrate 470, and each of the bond pads 490 include a second metallic layer 492. In some embodiments, the second metallic layer 492 is made of a material that is the different from that of the first metallic layer 434, such as AlCu.

In some embodiments, the second substrate 470 includes CMOS, and the vertical conductive features 472 may be contacts or vias, and the horizontal conductive features 474 may be metal lines or sensing plates.

Figure 6I:
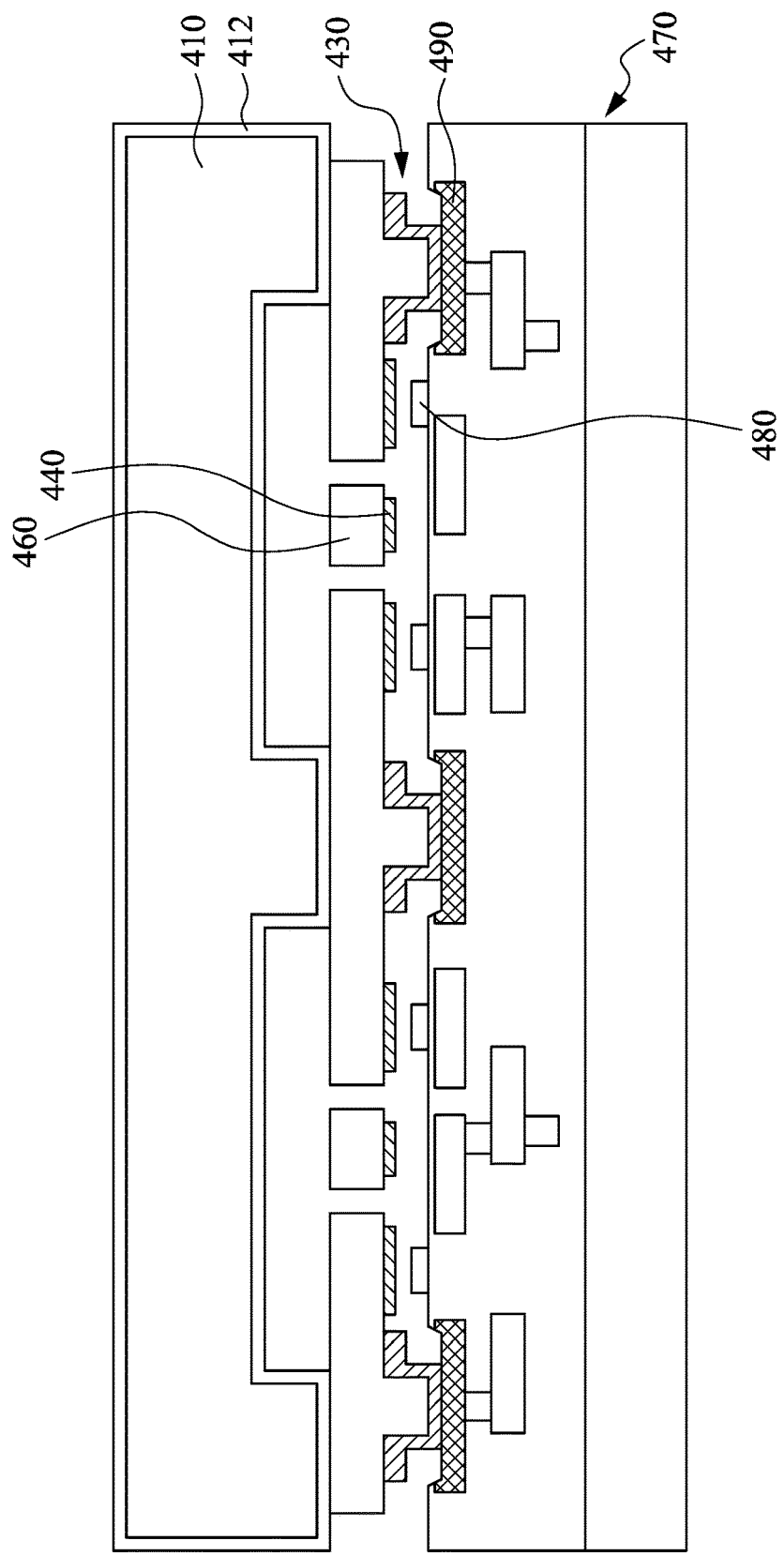

Referring to FIG. 6I, the first substrate 410 is bonded with the second substrate 470 through the bond rings 430 and the bond pads 490 to form the semiconductor structure 400. The first substrate 410 and the second substrate 470 may be bonded by any suitable processes, such as eutectic bonding, thermal compression bonding, and adhesive bonding. In some embodiments, the bond rings 430 include the first metallic layer 434, which is made of Ge, the bond pads 390 include the second metallic layer 492, which is made of AlCu, and the first substrate 410 and the second substrate 470 is bonded by eutectic bonding.

The difference between the fabricating methods shown in FIGS. 6A through 6I and FIGS. 4A through 4J is the hard mask removing process. The fabricating method shown in FIGS. 4A through 4J applies oxide as the material of the hard mask 250, and the hard mask 250 is removed by dry etching. The fabricating method shown in FIGS. 6A through 6I applies three metal as the material of the hard mask 450, and the hard mask 450 is removed by wet etching. This difference does not affect the functions of each component in the embodiment. Therefore, the semiconductor structure 400 has the same functions and advantages as the semiconductor structure 200.

The embodiments of the present disclosure discussed above have advantages over exiting methods and systems. The MEMS device and the semiconductor structure of the present disclosure include an anti-stiction layer, which has anti-stiction properties of hydrophobic and/or low adhesion force. Further, the anti-stiction layer is high thermo resistant, and the anti-stiction properties may still exist after undergoing thermo processes. Therefore, the probability of the in-use stiction of the MEMS device can be largely decreased, and a less stiff MEMS device can be fabricated to enhance the sensitivity of the semiconductor structure. It is understood, however, that other embodiments may have different advantages, and that no particular advantages is required for all embodiments.

In accordance with some embodiments of the present disclosure, a method includes forming a recess in a first substrate, bonding a micro-electro-mechanical systems (MEMS) substrate to the first substrate after forming the recess in the first substrate, forming an anti-stiction layer over the micro-electro-mechanical systems (MEMS) substrate, patterning the anti-stiction layer, etching the MEMS substrate to form a MEMS device, and bonding the MEMS device and the first substrate to a second substrate. The patterned anti-stiction layer is between the MEMS device and the second substrate.

In accordance with other embodiments of the present disclosure, a method includes bonding a micro-electro-mechanical systems (MEMS) substrate to a first substrate, etching the MEMS substrate to form a bond anchor, forming a first metallic layer over the bond anchor, forming an anti-stiction layer over the micro-electro-mechanical systems (MEMS) substrate, etching the MEMS substrate to form a MEMS device, and bonding the first metallic layer over the bond anchor to a bond pad over a second substrate.

In accordance with yet other embodiments of the present disclosure, a method includes bonding a micro-electro-mechanical systems (MEMS) substrate to a first substrate, forming an anti-stiction layer over the micro-electro-mechanical systems (MEMS) substrate, patterning the anti-stiction layer, etching the MEMS substrate to form a MEMS device, and bonding the MEMS device and the first substrate to a second substrate. The patterned anti-stiction layer is substantially aligned with a bump structure over the second substrate after bonding the MEMS device and the first substrate to the second substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a recess in a first substrate;
   bonding a micro-electro-mechanical systems (MEMS) substrate to the first substrate after forming the recess in the first substrate;
   forming an anti-stiction layer over the micro-electro-mechanical systems (MEMS) substrate;
   forming a hard mask over the anti-stiction layer;
   pattering the anti-stiction layer;
   after forming and patterning the anti-stiction layer, etching the MEMS substrate to form a MEMS device, wherein the patterned anti-stiction layer is between the hard mask and the MEMS device after etching the MEMS substrate; and
   bonding the MEMS device and the first substrate to a second substrate, wherein the patterned anti-stiction layer is between the MEMS device and the second substrate.

2. The method of claim 1, further comprising:
   depositing an etch stop layer over the first substrate prior to bonding the MEMS substrate to the first substrate.

3. The method of claim 1, further comprising:
   forming a self-assembled monolayer (SAM) coating over the second substrate, wherein the SAM coating is between the MEMS device and the second substrate after bonding the MEMS device and the first substrate to the second substrate.

4. The method of claim 3, wherein forming the SAM coating is performed such that the SAM coating covers a bump structure over the second substrate.

5. The method of claim 1, wherein bonding the MEMS device and the first substrate to the second substrate is performed by eutectic bonding, thermal compression bonding, adhesive bonding, or combinations thereof.

6. The method of claim 1, further comprising:
   etching the MEMS substrate to form a bond anchor prior to forming the anti-stiction layer.

7. The method of claim 6, further comprising:
   depositing a metallic layer over the bond anchor.

8. The method of claim 1, wherein etching the MEMS substrate is performed such that a through hole is formed in the MEMS substrate and in communication with the recess.

9. The method of claim 3, wherein forming the SAM coating is performed after bonding the MEMS device to the second substrate.

10. A method, comprising:
    bonding a micro-electro-mechanical systems (MEMS) substrate to a first substrate;
    etching the MEMS substrate to form a bottom portion and a bond anchor protruding from a top surface of the bottom portion;
    forming a first metallic layer over the bond anchor;
    forming an anti-stiction layer over the micro-electro-mechanical systems (MEMS) substrate, wherein the anti-stiction layer is thinner than the first metallic layer;
    forming a hard mask over the anti-stiction layer;
    patterning the anti-stiction layer;
    etching the MEMS substrate to form a MEMS device, wherein the patterned anti-stiction layer is between the hard mask and the MEMS device after etching the MEMS substrate; and
    bonding the first metallic layer over the bond anchor to a bond pad over a second substrate.

11. The method of claim 10, further comprising:
    removing the hard mask after etching the MEMS substrate to form the MEMS device.

12. The method of claim 10, wherein the hard mask and the first metallic layer comprise different metals.

13. The method of claim 10, wherein the anti-stiction layer comprises amorphous carbon.

14. The method of claim 10, wherein the bond pad comprises a second metallic layer and a third metallic layer, and the third metallic layer is sandwiched between the first metallic layer and the second metallic layer after bonding the first metallic layer over the bond anchor to the bond pad over the second substrate.

15. A method, comprising:
  etching a recess in a first substrate;
  after etching the recess in the first substrate, forming an etch stop layer in the recess of the first substrate;
  bonding a micro-electro-mechanical systems (MEMS) substrate to the first substrate;
  forming an anti-stiction layer over the micro-electro-mechanical systems (MEMS) substrate;
  forming a hard mask over the anti-stiction layer;
  patterning the anti-stiction layer;
  etching the MEMS substrate to form a MEMS device, wherein the patterned anti-stiction layer is between the hard mask and the MEMS device after etching the MEMS substrate; and
  bonding the MEMS device and the first substrate to a second substrate, wherein the patterned anti-stiction layer is substantially aligned with a bump structure over the second substrate after bonding the MEMS device and the first substrate to the second substrate.

16. The method of claim 15, wherein the patterned anti-stiction layer is spaced from the bump structure after bonding the MEMS device and the first substrate to the second substrate.

17. The method of claim 15, wherein the anti-stiction layer is hydrophobic.

18. The method of claim 15, wherein the bump structure comprises metal.

19. The method of claim 15, wherein a surface of the patterned anti-stiction layer is exposed after bonding the MEMS device and the first substrate to the second substrate.

20. The method of claim 15, further comprising:
  removing the hard mask after etching the MEMS substrate.

* * * * *